US 009465553 B2

United States Patent
Ju et al.

(10) Patent No.: US 9,465,553 B2
(45) Date of Patent: Oct. 11, 2016

(54) NON-VOLATILE MEMORY SYSTEMS AND METHODS OF MANAGING POWER OF THE SAME

(71) Applicant: Samsung Electronics Co., Ltd., Suwon-si, Gyeonggi-do (KR)

(72) Inventors: Jae-Hyeon Ju, Seoul (KR); Young Joon Choi, Seongnam-si (KR); Han Gu Sohn, Suwon-si (KR); Hyo Jin Jeong, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/813,291

(22) Filed: Jul. 30, 2015

(65) Prior Publication Data

US 2015/0339075 A1    Nov. 26, 2015

Related U.S. Application Data

(62) Division of application No. 13/200,715, filed on Sep. 29, 2011, now Pat. No. 9,098,398.

(30) Foreign Application Priority Data

Sep. 29, 2010  (KR) .................. 10-2010-0094638

(51) Int. Cl.
*G06F 3/06* (2006.01)
*G06F 12/02* (2006.01)

(52) U.S. Cl.
CPC ........... *G06F 3/0625* (2013.01); *G06F 3/0634* (2013.01); *G06F 3/0679* (2013.01); *G06F 12/0246* (2013.01); *G06F 12/0292* (2013.01); *G06F 2212/1028* (2013.01); *Y02B 60/1225* (2013.01)

(58) Field of Classification Search
None
See application file for complete search history.

(56) References Cited

U.S. PATENT DOCUMENTS

| 7,613,880 | B2 | 11/2009 | Miura et al. |
| 2001/0048616 | A1 | 12/2001 | Ayukawa et al. |
| 2003/0156473 | A1* | 8/2003 | Sinclair ............... G06F 9/4403 365/200 |
| 2009/0024819 | A1 | 1/2009 | Fisher et al. |
| 2009/0089489 | A1 | 4/2009 | Mukaida et al. |
| 2010/0162084 | A1 | 6/2010 | Coulson et al. |
| 2010/0169551 | A1 | 7/2010 | Yano et al. |

FOREIGN PATENT DOCUMENTS

| JP | 2008186243 A | 8/2008 |
| KR | 100764875 B1 | 10/2007 |
| KR | 100786603 B1 | 12/2007 |

* cited by examiner

*Primary Examiner* — Denise Tran
(74) *Attorney, Agent, or Firm* — Harness, Dickey & Pierce, P.L.C.

(57) ABSTRACT

A non-volatile memory system and a method of managing the power of the same are provided. The non-volatile memory system includes a non-volatile memory configured to store a first mapping table comprising a list of a logical address and a physical address corresponding to the logical address with respect to a code region and a list of a logical address and a physical address corresponding to the logical address with respect to a general purpose (GP) region, and a controller configured to load the first mapping table from the non-volatile memory to a first memory and load the second mapping table from the non-volatile memory to a second memory. Power-up of the second memory is delayed with respect to power-up of the non-volatile memory system and the first or second memory is powered down if a condition is satisfied, so that power consumption of the non-volatile memory system is reduced.

8 Claims, 29 Drawing Sheets

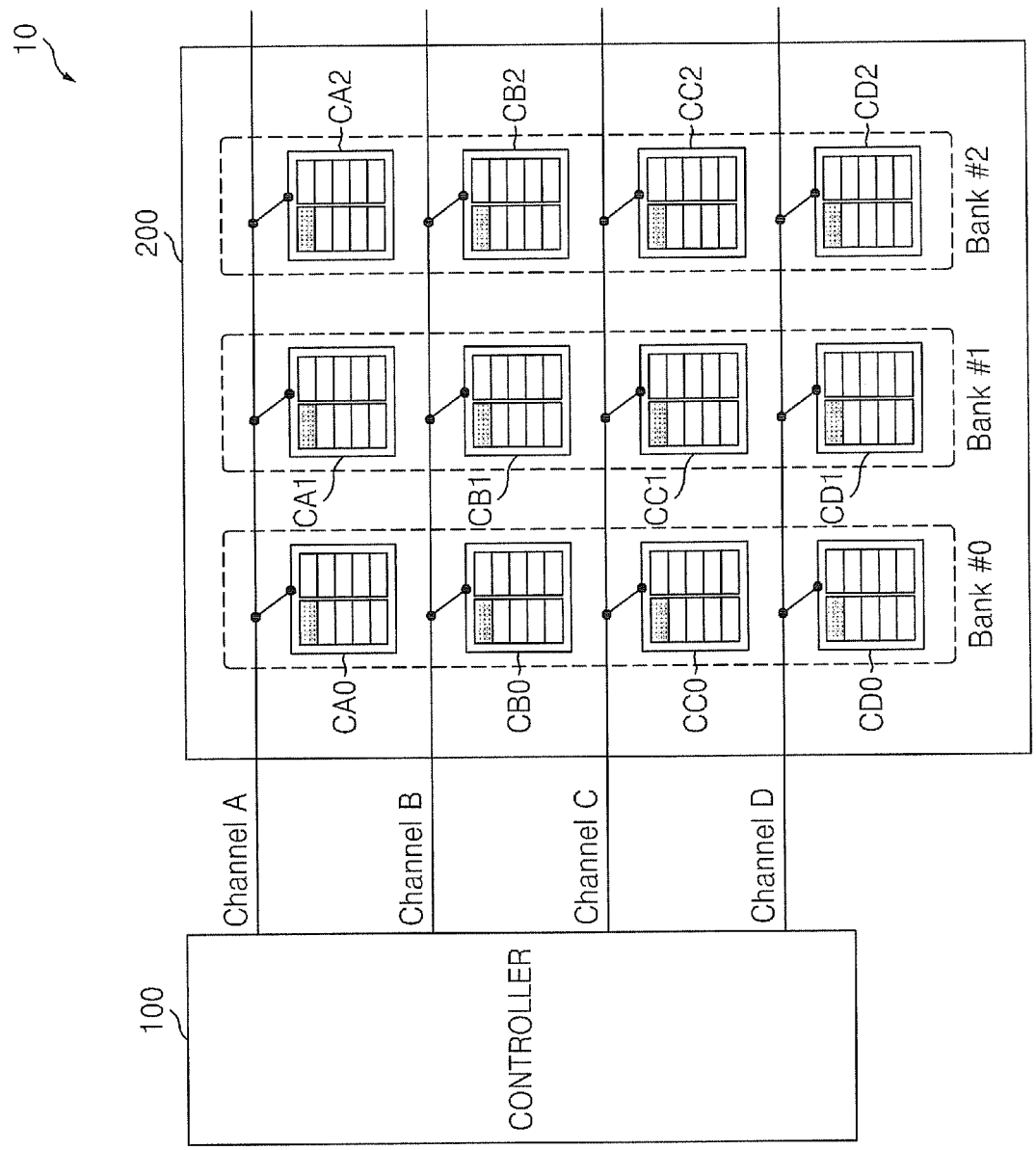

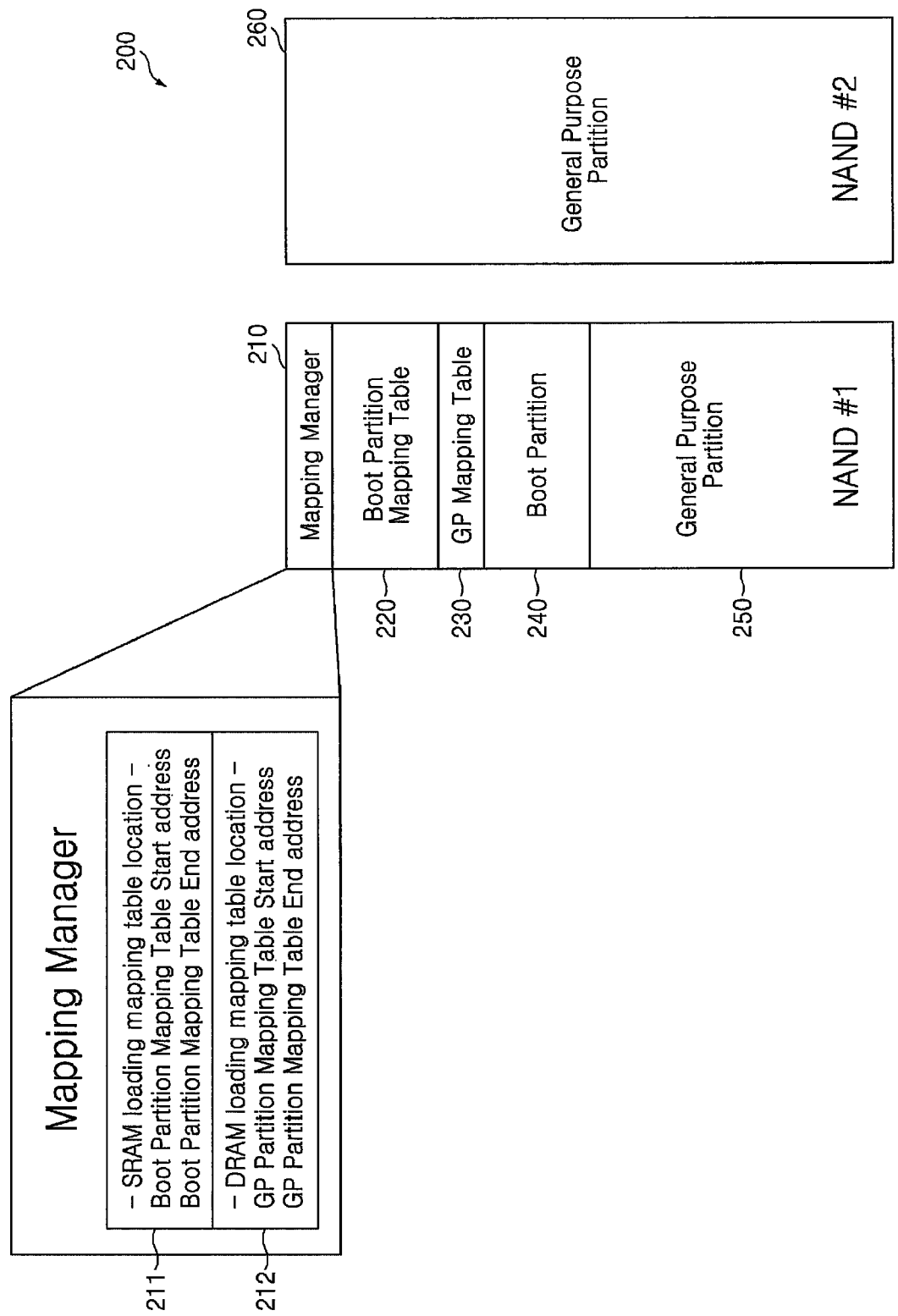

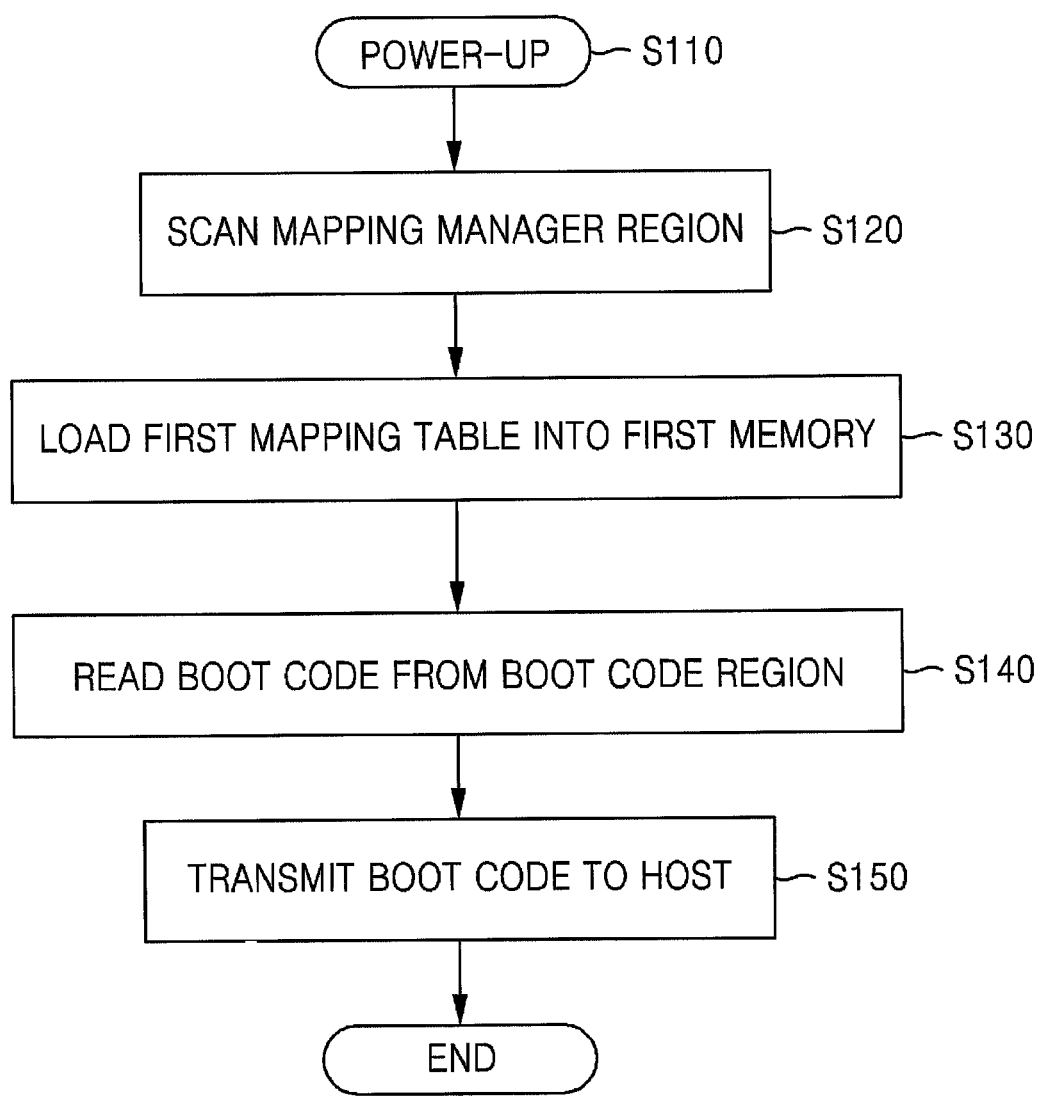

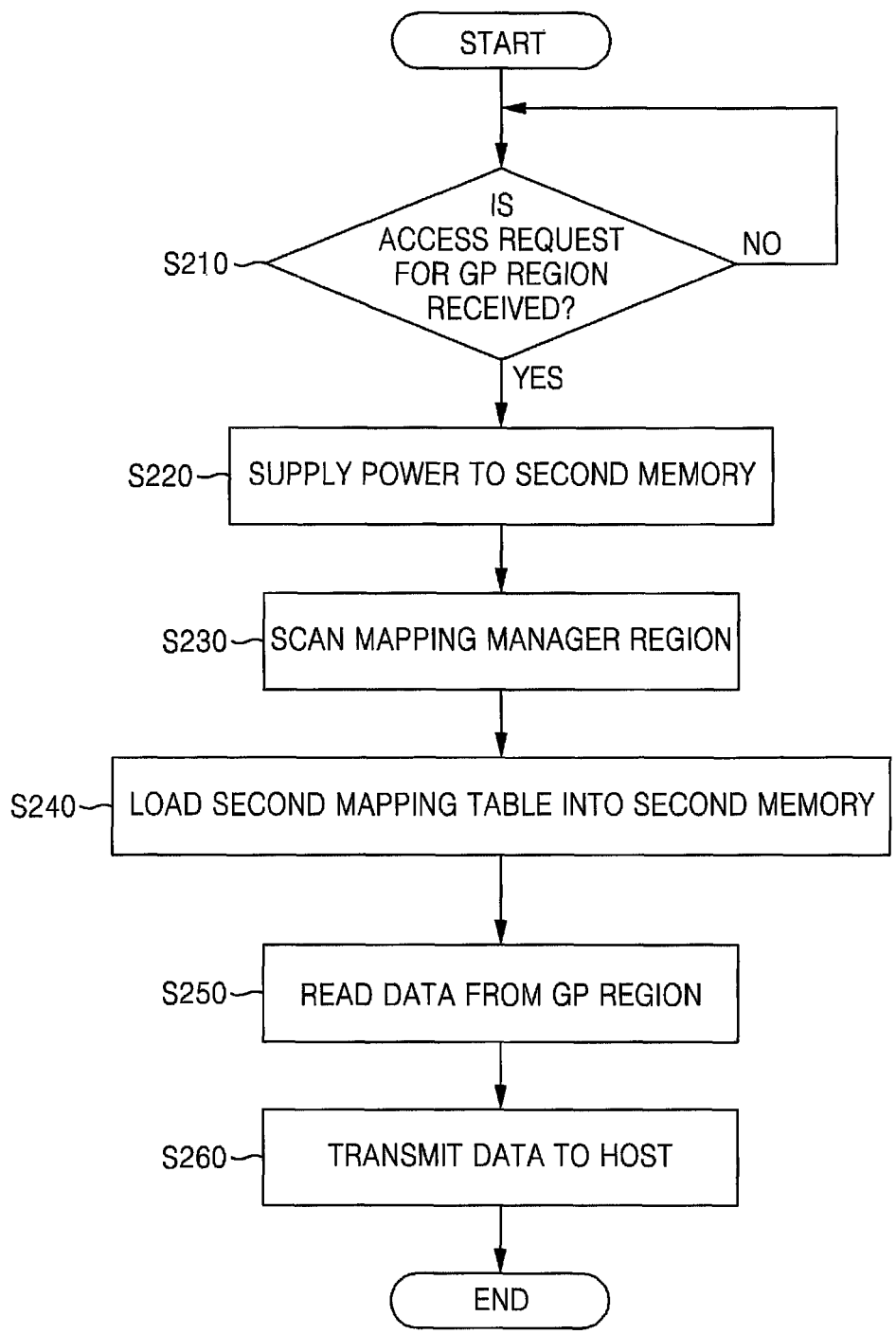

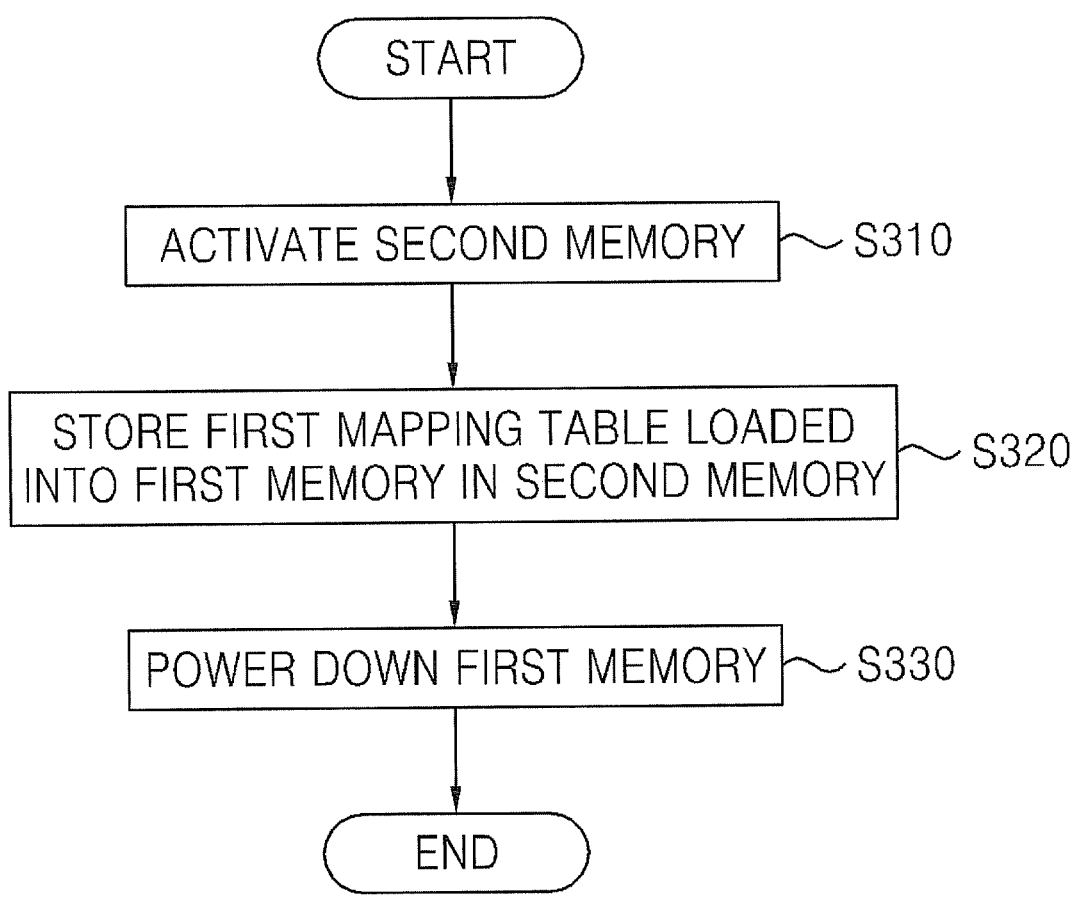

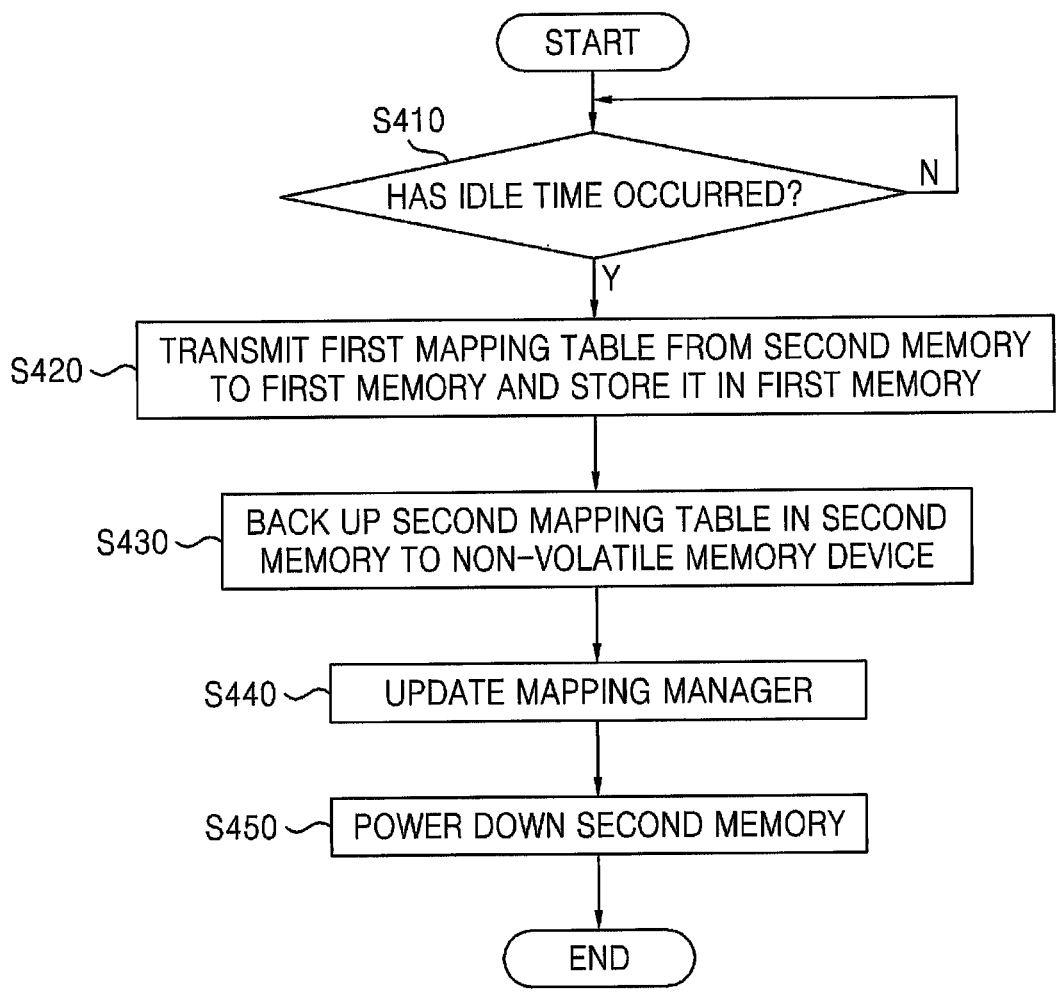

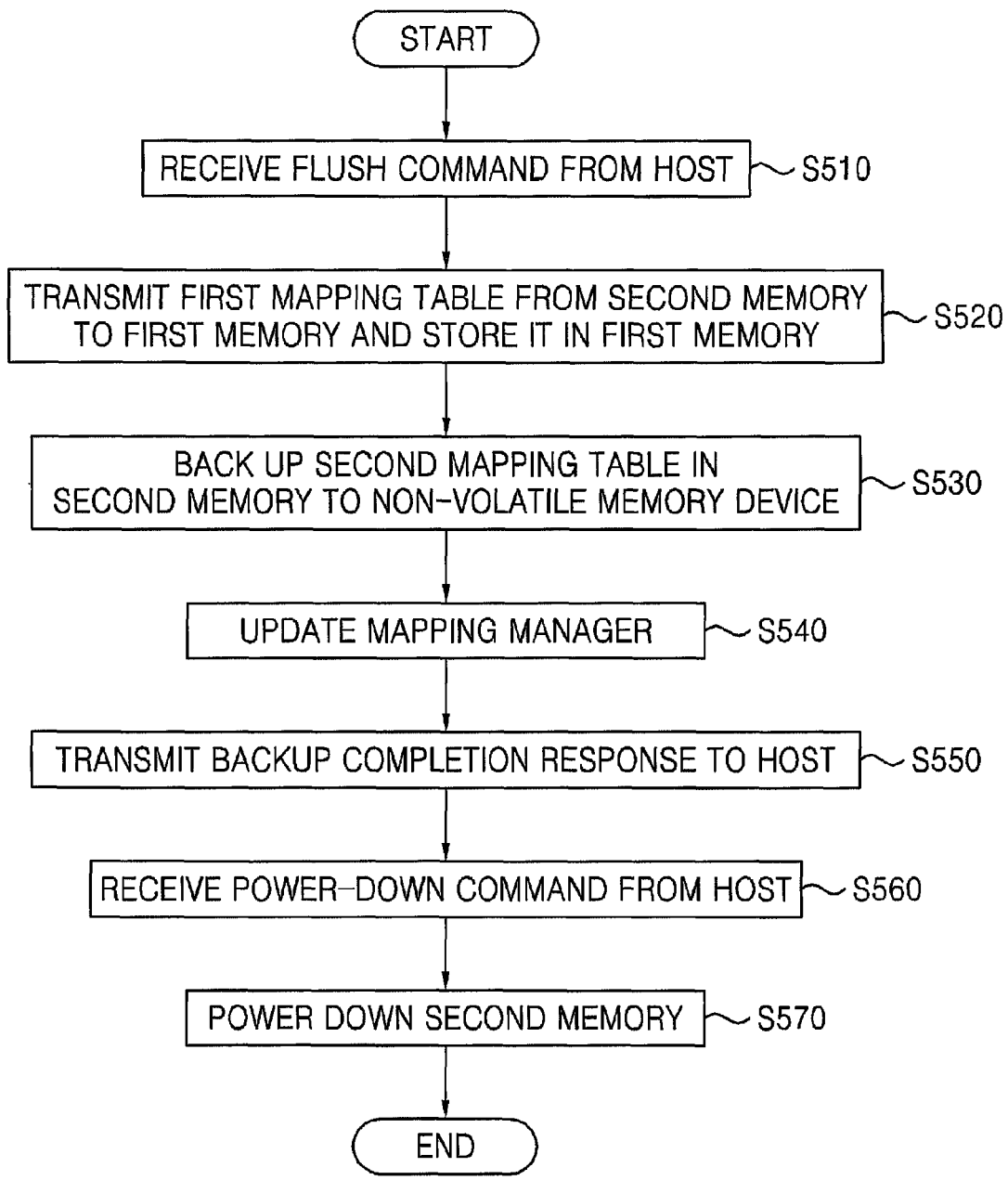

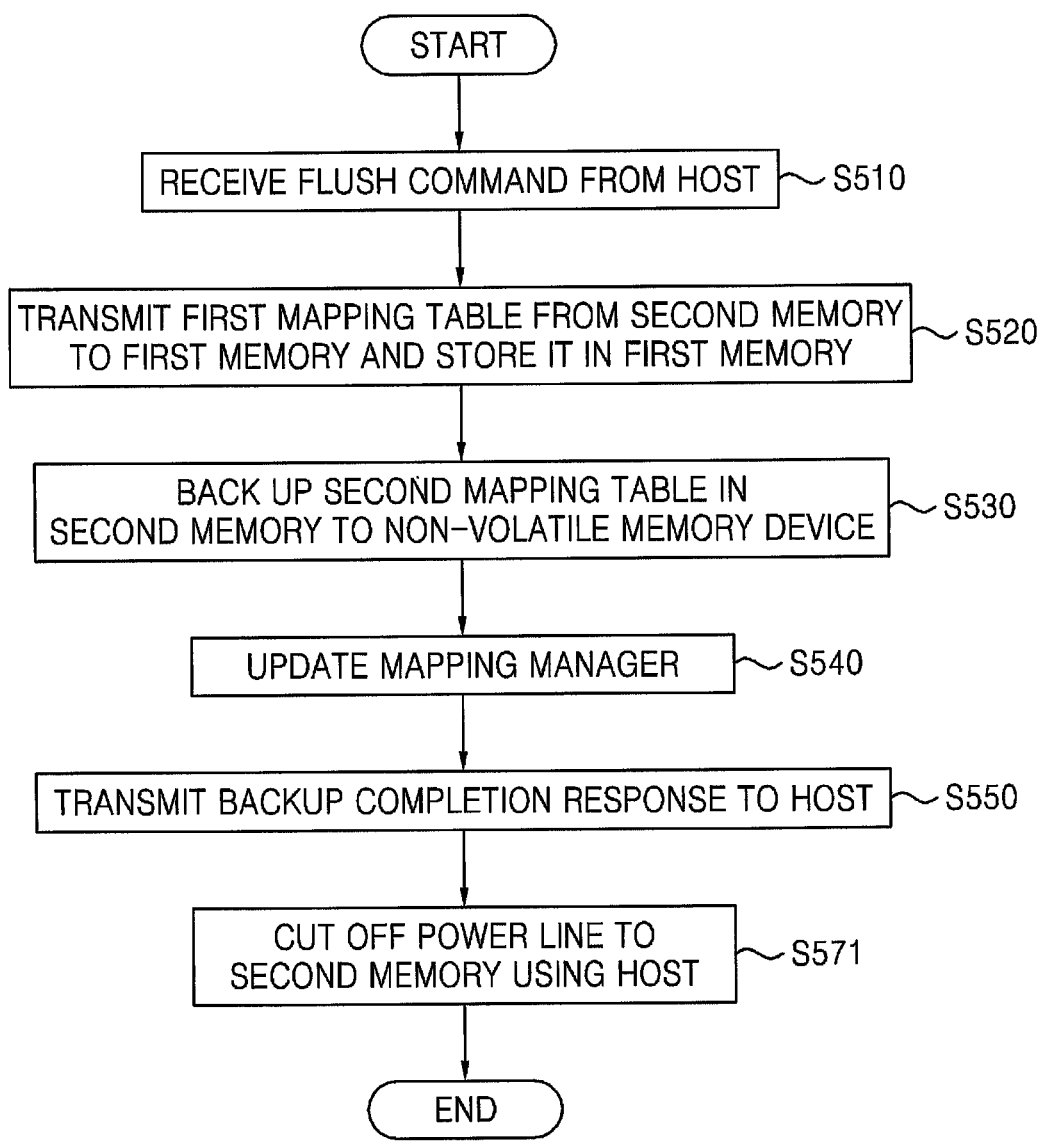

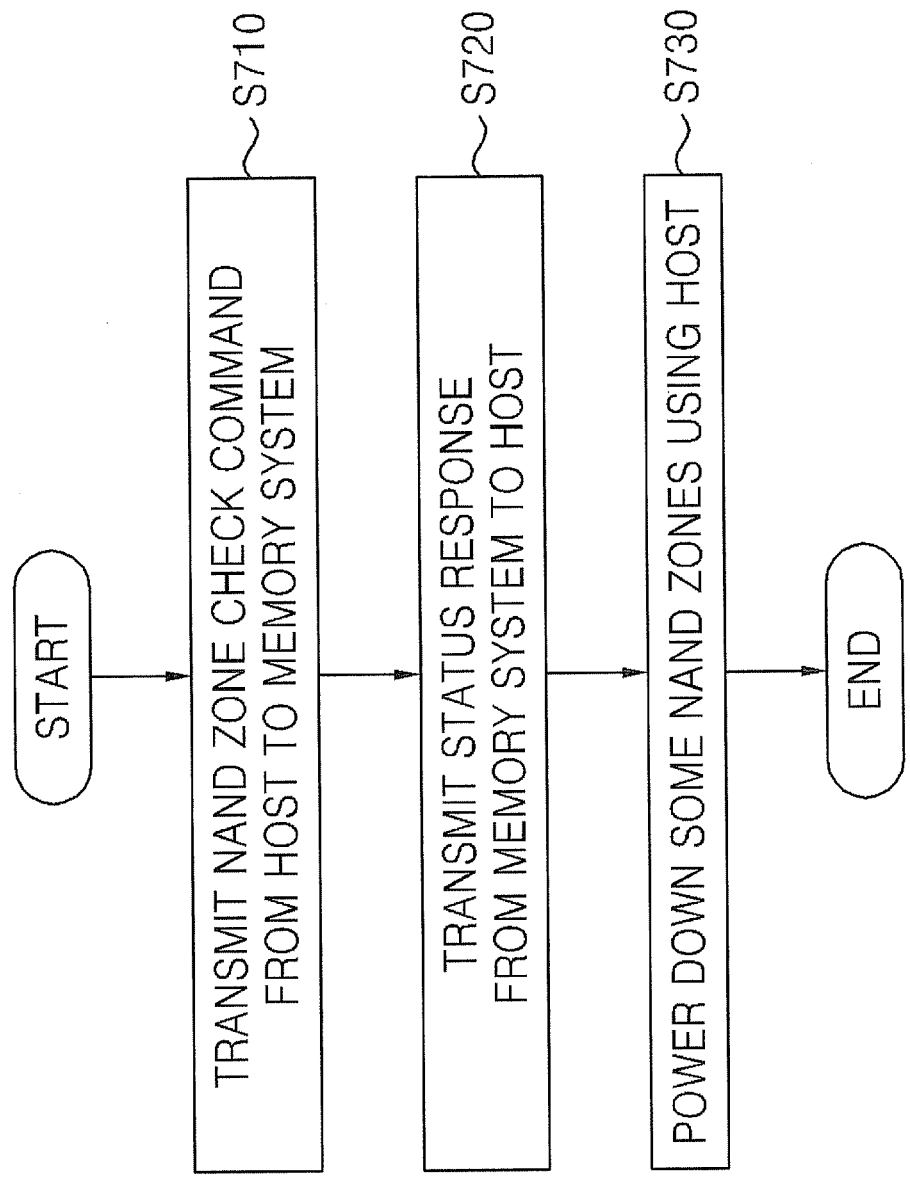

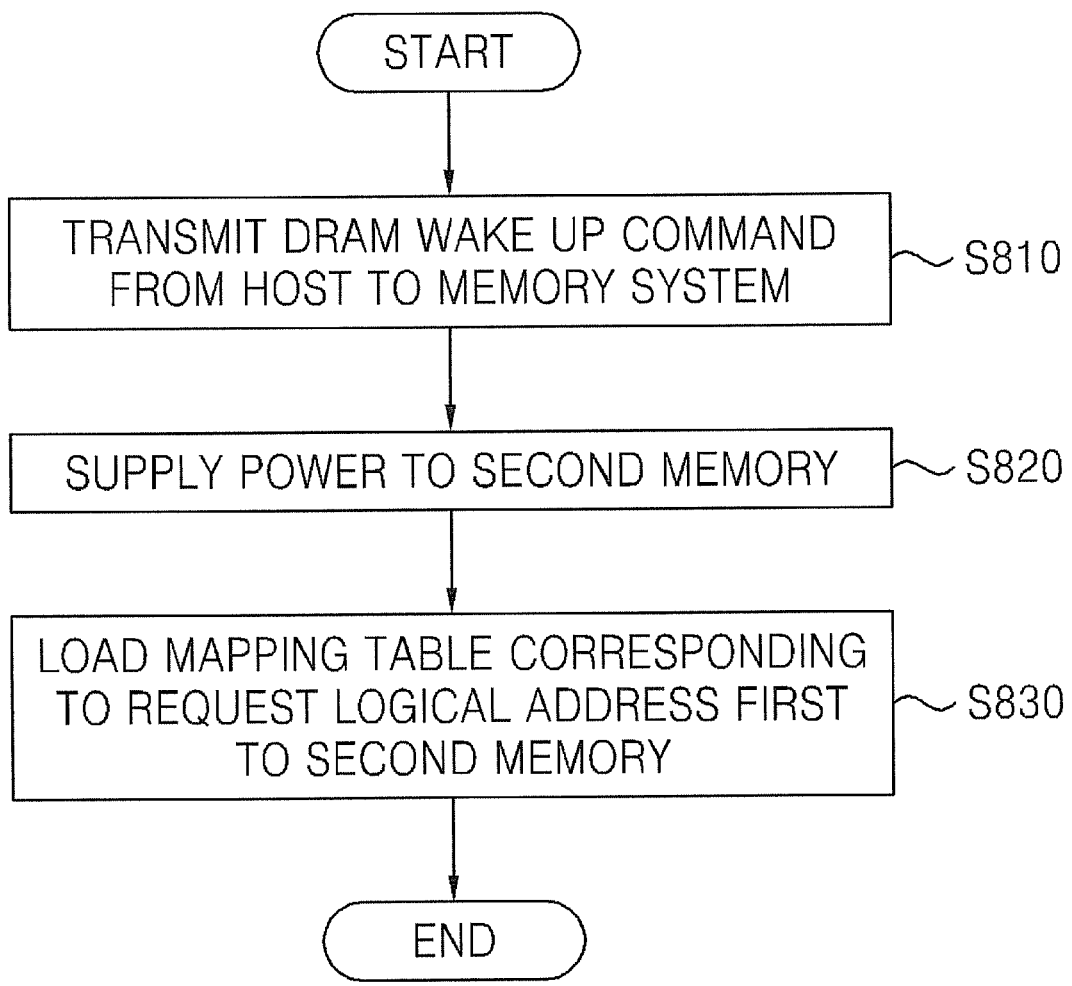

FIG. 13A

| command | DRAM power on/off | Remark |
|---|---|---|
| standby | 0 : off / 1 : on | — |

FIG. 13B

| Response | DRAM power on/off ready | Remark |
|---|---|---|
| status | 0 : off / 1 : on | — |

FIG. 13C

| command | DRAM power on/off | Remark |
|---|---|---|
| DPD | 0 : off / 1 : on | – |

FIG. 13D

| command | Boot code zone | Remark |
|---|---|---|
| Zone check | — | — |

FIG. 13E

| Response | Boot code zone | Remark |
|---|---|---|
| Zone status | 0~3 | - |

FIG. 13F

| command | Request logical address | Remark |
|---|---|---|
| DRAM wake up | Logical address | – |

FIG. 15A

| Original Sleep(CMD5) | Argument[15] sleep/awake | | | | |
|---|---|---|---|---|---|
| | | Controller | Off | | |
| | | DRAM | Off | | |
| | | NAND #1(code) | Off | | |
| | | NAND #2(data) | Off | | |

FIG. 15B

| Half Sleep(CMD5) Argument[14] DPD/awake | |
|---|---|
| Controller | On |
| DRAM | Off |
| NAND #1(code) | On |
| NAND #2(data) | Off(optional) |

FIG. 15C

| CMD5 | ac | [31:16] RCA<br>[15] Sleep/Awake<br>[14:0] stuff bits | R1b | SLEEP_AWAKE | Toggles the card between sleep state and standby state. |

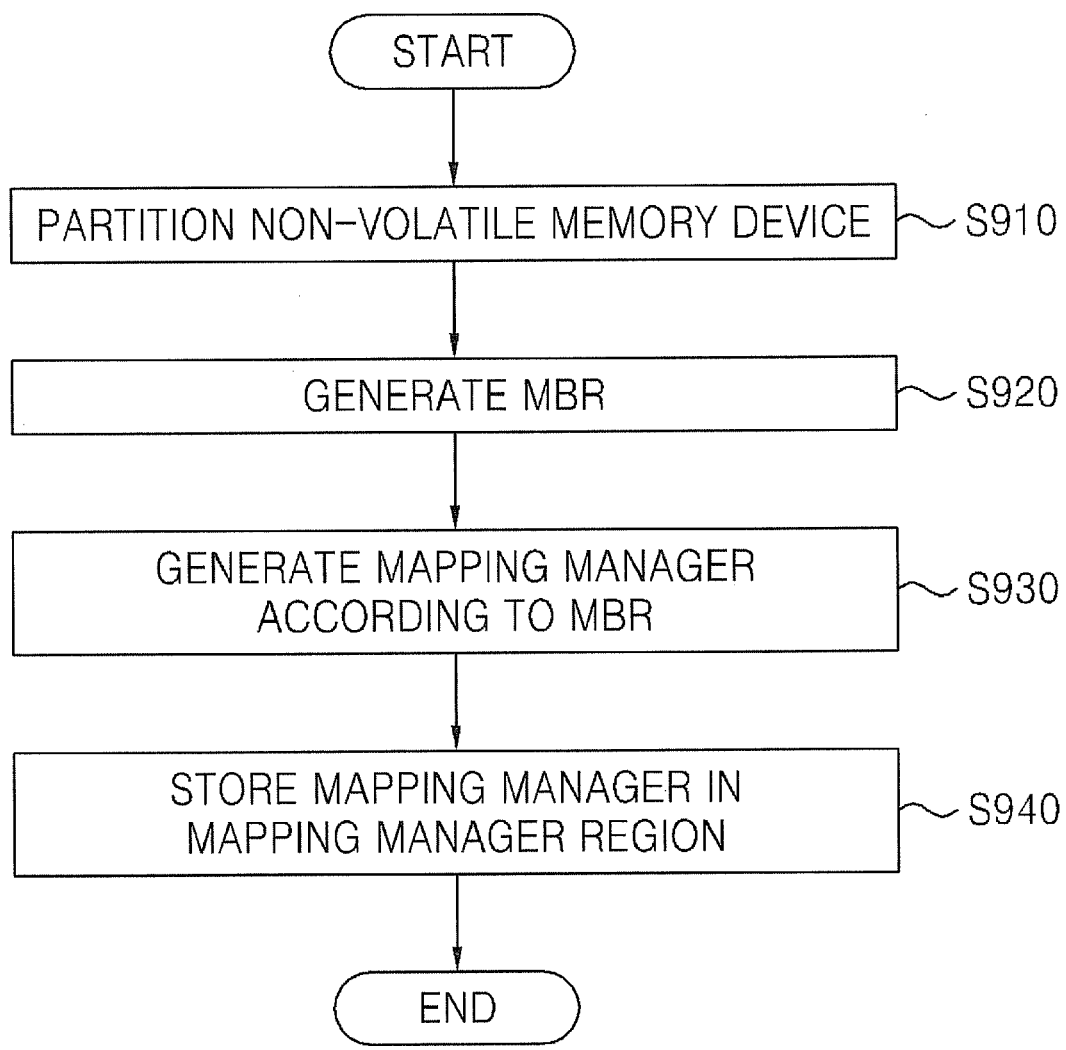

FIG. 17
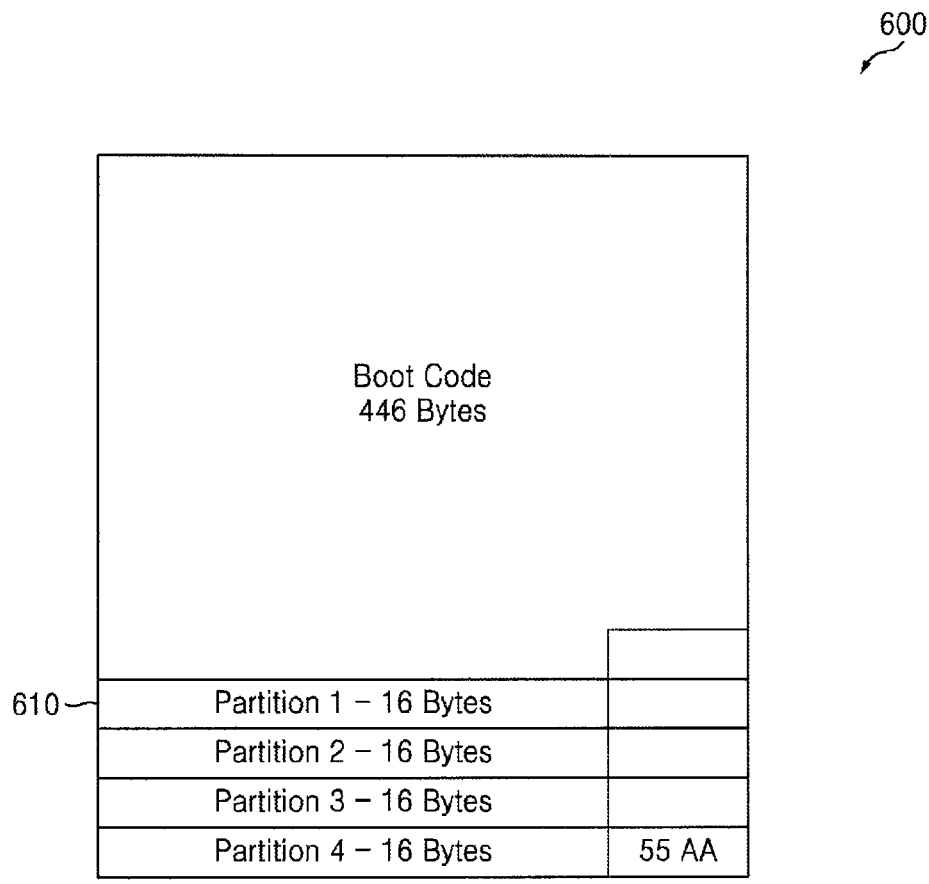
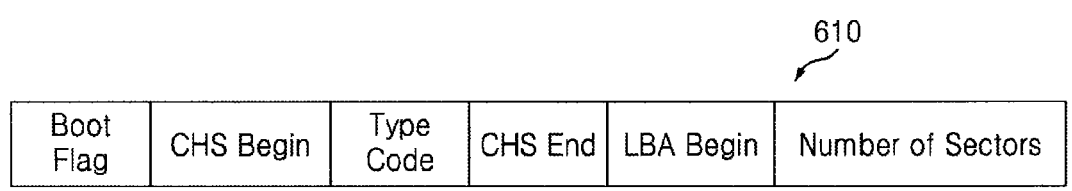

NON-VOLATILE MEMORY SYSTEMS AND METHODS OF MANAGING POWER OF THE SAME

CROSS-REFERENCE TO RELATED APPLICATIONS

This application is a divisional application of and claims priority under 35 U.S.C. §120/121 to U.S. application Ser. No. 13/200,715 filed Sep. 29, 2011, which issued on Aug. 4, 2015 as U.S. Pat. No. 9,098,398, which claims priority under 35 U.S.C. §119(a) to Korean Patent Application No. 10-2010-0094638 filed on Sep. 29, 2010, the entire contents of each of these applications is incorporated herein by reference.

BACKGROUND

At least one example embodiment relates to a memory system, and more particularly, to a non-volatile memory system and a method of managing the power of the same.

Demand for non-volatile memory systems supporting a large capacity has been increasing. A non-volatile memory system is a data storage system using a non-volatile semiconductor memory. A flash memory apparatus is a non-volatile memory system usually used in portable electronic equipment. A flash memory is non-volatile like a hard disk and has a fast access speed and low power consumption and is thus widely used in embedded systems or mobile systems.

Flash translation layer (FTL) is software for managing flash memory. The FTL receives a logical address from a file system and translates the logical address into a physical address. The logical address is an address that is recognized in the file system and the physical address is an address that is recognized in the flash memory. The FTL refers to an address mapping table to manage address mapping. The address mapping table stores a logical address and a physical address corresponding to the logical address. The size of the address mapping table may vary with a mapping unit. A page mapping method, a block mapping method, and a hybrid mapping method are common mapping methods.

In the page mapping method, mapping is performed in units of pages. In the block mapping method, mapping is performed in units of blocks. In the hybrid mapping method, both the page mapping method and the block mapping method are used.

Usually, a single block includes several tens or hundreds of pages. Accordingly, the size of the mapping table in the page mapping method is several tens or hundreds of times larger than that in the block mapping method. In other words, an address mapping table in the page mapping method uses more memory than an address mapping table in the block mapping method.

An address mapping table is usually driven in volatile random access memory (RAM). When the address mapping table is loaded into and used in static RAM (SRAM), the block mapping method is usually used since the size of the SRAM is small. When the address mapping table is loaded into and used in large-capacity dynamic RAM (DRAM), the page mapping method is usually used.

Using DRAM causes standby current and operating current to increase, resulting in an increase of power consumption of a non-volatile data storage device and an electronic system (e.g., a portable electronic system) including the non-volatile data storage device.

SUMMARY

At least some example embodiments provide a non-volatile memory system for reducing power consumption of a data storage device using a high current consuming volatile memory and a method of managing the power of the same.

At least some example embodiments also provide a non-volatile memory system for reducing power consumption by managing an address mapping table in different types of volatile memory and a method of managing the power of the same.

According to at least some example embodiments, there is provided a non-volatile memory system including a non-volatile memory configured to store a first mapping table including a list of logical addresses and physical addresses corresponding to the logical addresses with respect to a code region in the non-volatile memory and a list of a logical address and a physical address corresponding to the logical address with respect to a general purpose (GP) region in the non-volatile region, the GP region configured to store at least one of user data and an application program, and a controller configured to load the first mapping table from the non-volatile memory to a first volatile memory and load the second mapping table from the non-volatile memory to a second volatile memory. The second volatile memory is configured to receive a voltage independently of the controller.

At another example embodiment discloses a non-volatile memory system including a first volatile memory, a second volatile memory, a non-volatile memory configured to store a first mapping table including address information of a code region in the non-volatile memory and a second mapping table including address information of a general purpose (GP) region in the non-volatile memory, the GP region configured to store at least one of user data and an application program, and a controller configured to load the first mapping table from the non-volatile memory to the first volatile memory and load the second mapping table from the non-volatile memory to the second volatile memory. The second volatile memory is configured to receive a voltage independently of the controller.

Power-up of the second memory may be delayed with respect to power-up of the non-volatile memory system. While access to the GP region in the non-volatile memory is not necessary, the second memory may be powered down.

The non-volatile memory may be partitioned into the code region configured to store a boot code, the GP region, a first mapping table region configured to store the first mapping table, a second mapping table region configured to store the second mapping table, and a mapping manager region configured to store mapping manager information, the mapping manager information including address information of the first mapping table and address information of the second mapping table.

The controller is configured to scan the mapping manager region in the non-volatile memory, extract the address information of the first mapping table, load the first mapping table to the first volatile memory according to the address information of the first mapping table, read the boot code from the code region using the first mapping table, and transmit the boot code.

The controller is configured to supply power to the second volatile memory after the non-volatile memory system receives power, if the controller processes the access request for the GP region.

After supplying power to the second volatile memory, the controller is configured to scan the mapping manager information in the non-volatile memory, extract the address information of the second mapping table, and load the second mapping table to the second volatile memory according to the address information of the second mapping table.

After loading the second mapping table to the second volatile memory, the controller is configured to transmit the first mapping table from the first volatile memory to the second volatile memory, store the first mapping table in the second volatile memory, and power down the first volatile memory after storing the first mapping table in the second volatile memory.

The controller is configured to transmit the first mapping table stored in the second volatile memory to the first volatile memory, back up the second mapping table stored in the second volatile memory to the non-volatile memory, and power down the second volatile memory during an idle time.

When powering down the second memory, the controller is configured to determine the idle time if the controller does not receive a command for at least a period of time.

According to at least other example embodiments, there is provided a method of managing power in a non-volatile memory system which includes a non-volatile memory and a controller controlling the non-volatile memory. The method includes storing a first mapping table, the first mapping table including a list of logical addresses and physical addresses corresponding to the logical addresses with respect to a code region, storing a second mapping table, the second mapping table including a list of logical addresses and physical addresses corresponding to the logical addresses with respect to a GP region in the non-volatile memory, powering up the non-volatile memory and the controller, loading the first mapping table from the non-volatile memory to a first memory at the power-up, loading the second mapping table from the non-volatile memory to a second memory; and powering down the second memory based on the loading.

At least another example embodiment discloses a non-volatile memory system including a first memory configured to receive a first voltage, a non-volatile memory configured to store a mapping table, and a controller configured to load the mapping table from the non-volatile memory to the first memory and control operation of the first memory independently of the first voltage.

BRIEF DESCRIPTION I/F THE DRAWINGS

The above and other features and advantages will become more apparent by describing in detail example embodiments thereof with reference to the attached drawings in which:

FIG. 2A is a schematic diagram showing an example structure of a non-volatile memory device illustrated in FIG. 1;

FIG. 3 is a diagram showing a partition of the non-volatile memory device illustrated in FIG. 1 according to at least some example embodiments;

FIG. 4A is a flowchart of a method of managing the power of a memory system according to at least some example embodiments;

FIG. 5A is a flowchart of a method of managing the power of a memory system according to at least other example embodiments;

FIG. 6 is a flowchart of a method of managing the power of a memory system according to at least further example embodiments;

FIG. 7 is a flowchart of a method of managing the power of a memory system according to at least other example embodiments;

FIG. 8 is a flowchart of a method of managing the power of a memory system according to at least yet other example embodiments;

FIG. 9 is a flowchart of a method of managing the power of a memory system according to at least still other example embodiments;

FIG. 11 is a flowchart of a method of managing the power of a memory system according to at least other example embodiments;

FIG. 12 is a flowchart of a method of managing the power of a memory system according to at least other example embodiments;

FIGS. 13A through 13F are schematic diagrams each showing a command of a host or a response of a memory system;

FIGS. 15A and 15B are tables showing power states in an original sleep mode and a half sleep mode, respectively;

FIG. 15C is a diagram of the format of a host command for enabling a memory system to enter the original sleep mode according to at least some example embodiments;

FIG. 16 is a flowchart of a method of managing the power of a memory system according to at least further example embodiments;

FIG. 17 is a diagram showing the structure of a master boot record (MBR)

DETAILED DESCRIPTION I/F EXAMPLE EMBODIMENTS

Figure 1:
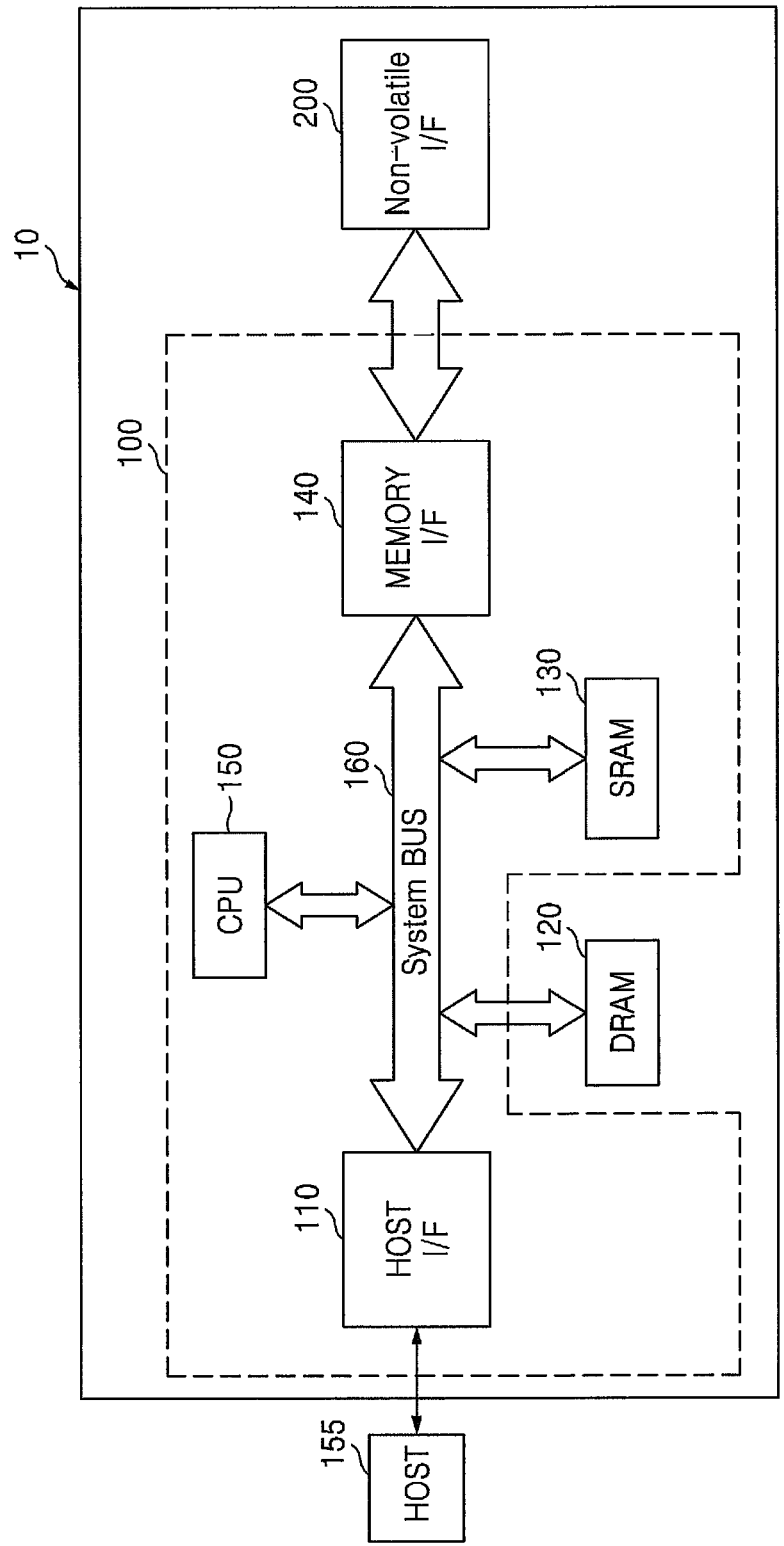
FIG. 1 is a schematic block diagram of a memory system according to at least some example embodiments.

Example embodiments now will be described more fully hereinafter with reference to the accompanying drawings, in which example embodiments are shown. Example embodiments may, however, be embodied in many different forms and should not be construed as limited to example embodiments set forth herein. Rather, example embodiments are provided so that this disclosure will be thorough and complete, and will fully convey the scope of example embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a memory system 10 according to at least some example embodiments. The memory system 10 may include a controller 100 and a non-volatile memory device 200. The memory system 10 may communicate with a host 155.

The memory system 10 may be a solid state drive (SSD), an embedded multimedia card (eMMC), or a secure digital (SD) card. It should be understood example embodiments are not restricted thereto. The non-volatile memory device 200 may be a flash memory device, but example embodiments are not restricted thereto. For instance, the non-volatile memory device 200 may be a phase-change random access memory (PRAM) device, a magnetoresistive RAM (MRAM) device, a resistive RAM (ReRAM) device, or a ferroelectric RAM (FeRAM) device. When the non-volatile memory device 200 is a flash memory device, the non-volatile memory device 200 may be a floating gate NAND flash memory device or a charge trap flash (CTF)-based NAND flash memory device. The non-volatile memory device 200 may include memory cell transistors arranged in two dimensions or three dimensions.

The controller 100 controls the overall operation of the memory system 10 and controls overall data exchange between the host 155 and the non-volatile memory device 200. For instance, the controller 100 writes or reads data by controlling the non-volatile memory device 200 at the request of the host 155. The controller 100 also controls a series of internal operations (e.g., performance adjustment, merging, and wear leveling) necessary to efficiently manage the non-volatile memory device 200 or the characteristics of the non-volatile memory device 200.

The non-volatile memory device 200 is a storage for storing data in non-volatile form and may store an operating system (OS), various programs, and various data. The structure of the controller 100 will be described in detail. The controller 100 may include a host interface (I/F) 110, a first memory 130 (e.g., a static random access memory (SRAM)), a memory I/F 140, a central processing unit (CPU) 150, and a bus 160. While a second memory 120 (e.g., a dynamic random access memory (DRAM)) is illustrated outside the controller 100, it should be understood that the second memory 120 may be part of the controller 100.

The host I/F 110 includes an interface protocol to communicate with the host 155. The interface protocol for the communication with the host 155 may be a peripheral component interconnect express (PCI-E) protocol, an advanced technology attachment (ATA) protocol, a serial ATA (SATA) protocol, a parallel ATA (PATA) protocol, or a serial attached small computer system interface (Serial Attached SCSI: SAS) protocol. However, the interface protocol between the host 155 and the memory system 10 is not restricted to the above examples. For instance, the interface protocol may be a universal serial bus (USB) protocol, a multimedia card (MMC) protocol, an enhanced small disk interface (ESDI) protocol, or an integrated drive electronics (IDE) protocol.

The first memory 130 is a volatile memory and may be an SRAM, but example embodiments are not restricted thereto. The second memory 120 is also a volatile memory and may be a DRAM, but example embodiments are not restricted thereto.

The second memory 120 and the first memory 130 store data and/or programs in volatile form. The first memory 130 and the second memory 120 load and drive first and second mapping tables, respectively, which will be described later. The memory I/F 140 interfaces with the non-volatile memory device 200.

The CPU 150 performs overall control operations to write data to and/or read data from the non-volatile memory device 200.

Although not shown, the memory system 10 may also include other elements such as a read-only memory (ROM), which stores code data executed when the memory system 10 is powered up, and an error correction code (ECC) engine, which encodes data to be stored in the non-volatile memory device 200 and decodes data read from the non-volatile memory device 200.

Although the first memory 130 is embodied within the controller 100 in FIG. 1, the first memory 130 may be embodied outside the controller 100 in other example embodiments.

FIG. 2A is an example schematic diagram showing the structure of the non-volatile memory device 200 illustrated in FIG. 1. Referring to FIG. 2A, the non-volatile memory device 200 may include a plurality of memory elements. FIG. 2A shows the non-volatile memory device 200 having a hardware structure of four channels and three banks, but example embodiments are not restricted to FIG. 2A.

In the memory system 10 illustrated in FIG. 2A, the controller 100 and the non-volatile memory device 200 are connected through four channels A, B, C, and D and flash memory elements CA0 through CA2, CB0 through CB2, CC0 through CC2, or CD0 through CD2 are connected to the channels A, B, C, and D, respectively. It is apparent that the number of channels and the number of banks may be changed.

Figure 2B:
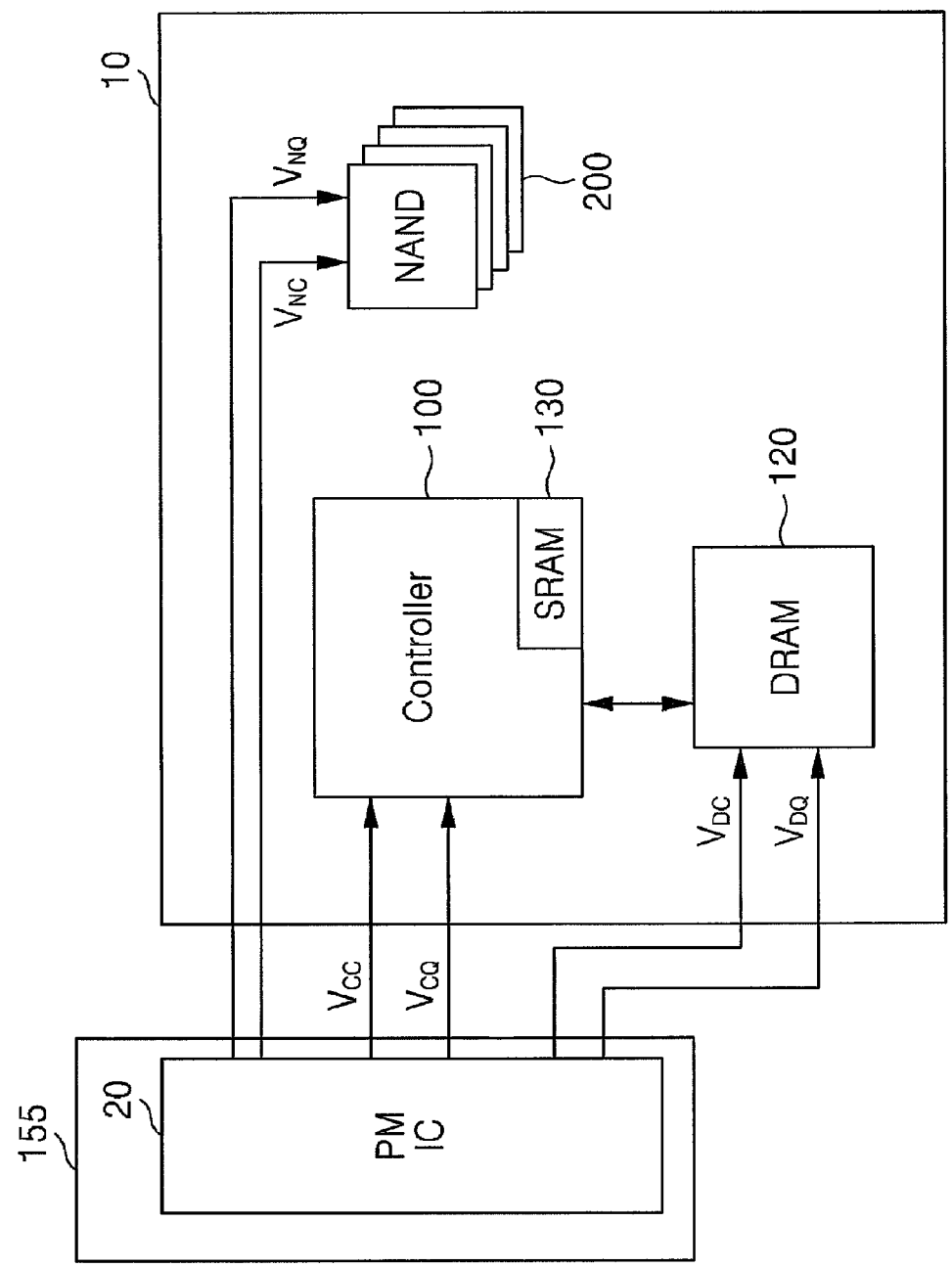
FIG. 2B is a diagram showing a power supply to elements of the memory system of FIG. 1 according to at least some example embodiments.

FIG. 2B is a diagram showing the power supply to elements of the memory system 10 according to at least some example embodiments. Referring to FIG. 2B, a power management integrated circuit (PMIC) 20 in the host 155 supplies power of different voltages to the controller 100, the second memory 120, and the non-volatile memory device 200 in the memory system 10. For instance, the PMIC 20 supplies a controller core voltage $V_{CC}$ and a controller peripheral voltage $V_{CQ}$ to the controller 100, supplies a DRAM core voltage $V_{DC}$ and a DRAM peripheral voltage $V_{DQ}$ to the second memory 120, and supplies a non-volatile memory core voltage $V_{NC}$ and a non-volatile peripheral voltage $V_{NQ}$ to the non-volatile memory device 200.

As described above, according to example embodiments, power may be independently supplied to the elements of the memory system 10 and power supply to each of the elements may be independently controlled. When the host 155 shuts down power to one of the elements in the memory system 10 (e.g., the second memory 120), the power down may be referred to as a physical power down or a hard power down. Additionally, the memory system 10 may internally power down at least one of the first memory 130 and the second memory 120. This may be referred to as a soft power down.

FIG. 3 is a diagram showing the partition of the non-volatile memory device 200 illustrated in FIG. 1 according to at least some example embodiments. The partition divides the entire memory area of the non-volatile memory device 200 into at least two regions. Referring to FIG. 3, the non-volatile memory device 200 may be partitioned into a mapping manager region 210, a first mapping table region 220, a second mapping table region 230, a boot code region 240, and general purpose (GP) regions 250 and 260. This partition may be logical or physical partition.

As illustrated in FIG. 3, the non-volatile memory device 200 may include a plurality of NAND memory elements NAND#1 and NAND#2. The NAND memory element NAND#1 may be partitioned into the mapping manager region 210, the first mapping table region 220, the second mapping table region 230, the boot code region 240, and the GP region 250. The NAND memory element NAND#2 may be entirely allocated for the GP region 260. The mapping manager region 210 stores mapping manager information including address information of the first mapping table 211 and address information of the second mapping table 212. The first mapping table region 220 stores an address mapping list of a logical address and a physical address corresponding to the logical address with respect to the boot code region 240. The second mapping table region 230 stores an address mapping list of a logical address and a physical address corresponding to the logical address with respect to the GP region 250.

The boot code region 240 stores a basic boot code or an OS, for the operation of an electronic system (e.g., portable electronic equipment) in which the memory system 10 is installed. The GP region 250 stores user data and an application program.

Figure 4B:
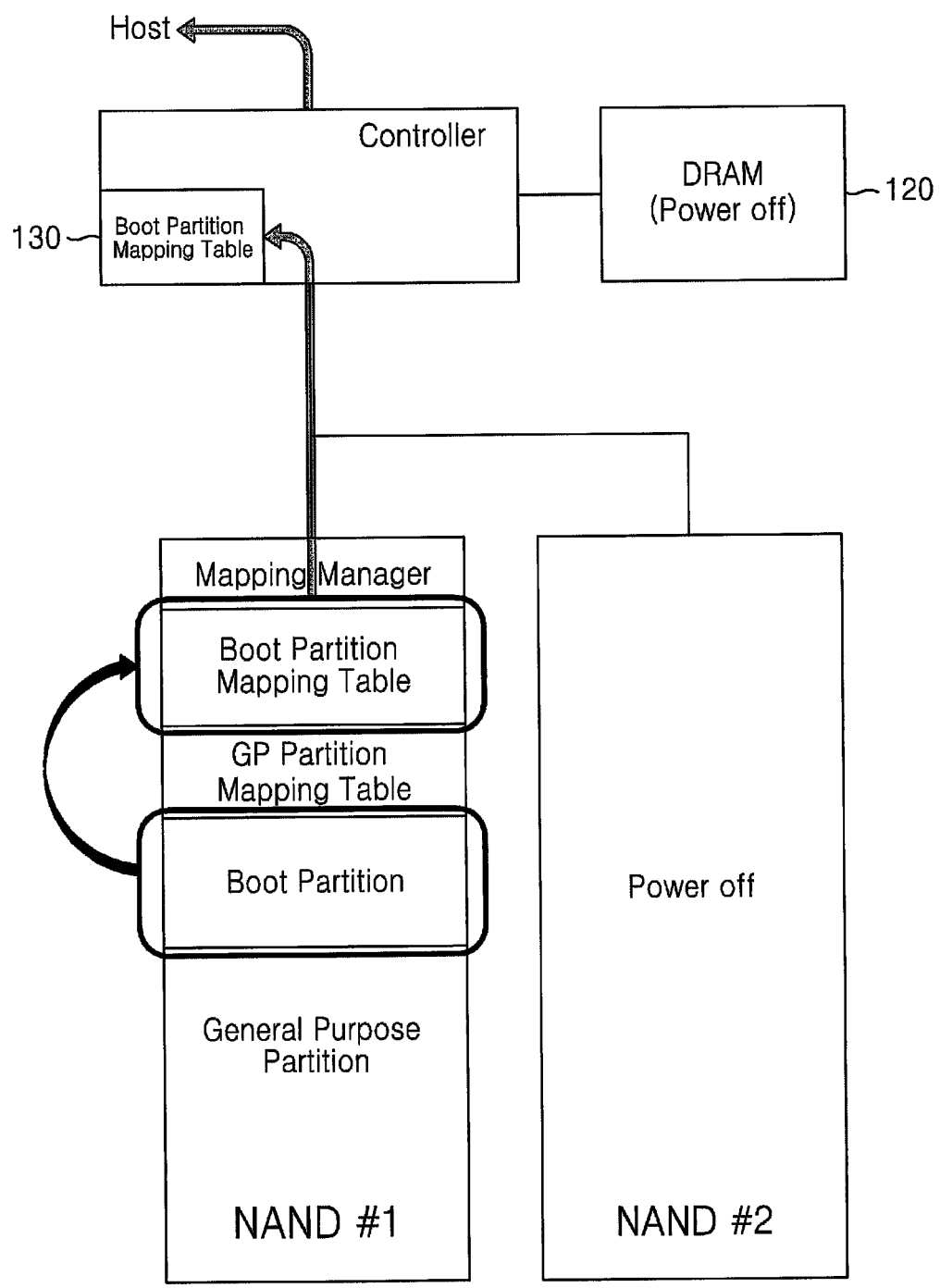
FIG. 4B is an example diagram for explaining the method illustrated in FIG. 4A.

FIG. 4A is a flowchart of a method of managing the power of the memory system 10 according to at least some example embodiments. FIG. 4B is a diagram for explaining the method illustrated in FIG. 4A.

Referring to FIGS. 4A and 4B, when the memory system 10 powers up in operation S110, the controller 100 scans the mapping manager region 210 of the non-volatile memory device 200 in operation S120 to check a physical address of the first mapping table to be loaded into the first memory 130. Thereafter, the controller 100 loads the first mapping table corresponding to the physical address into the first memory 130 in operation S130.

The controller 100 reads a boot code from the boot code region 240 with reference to the first mapping table loaded into the first memory 130 in operation S140. The boot code that has been read is transmitted to the host 155 through the host I/F 110 in operation S150. The host 155 performs booting using the boot code.

As described above, while the boot code is read and booting is performed, power supply to the second memory 120 may be interrupted. Accordingly, even when the memory system 10 powers up, the second memory 120 is powered down during the booting. After the booting is completed, power may be supplied to the second memory 120.

Accordingly, the memory system 10 delays power supply to the second memory 120 so that power is supplied after a power-up moment, thereby reducing power consumption.

Figure 5B:
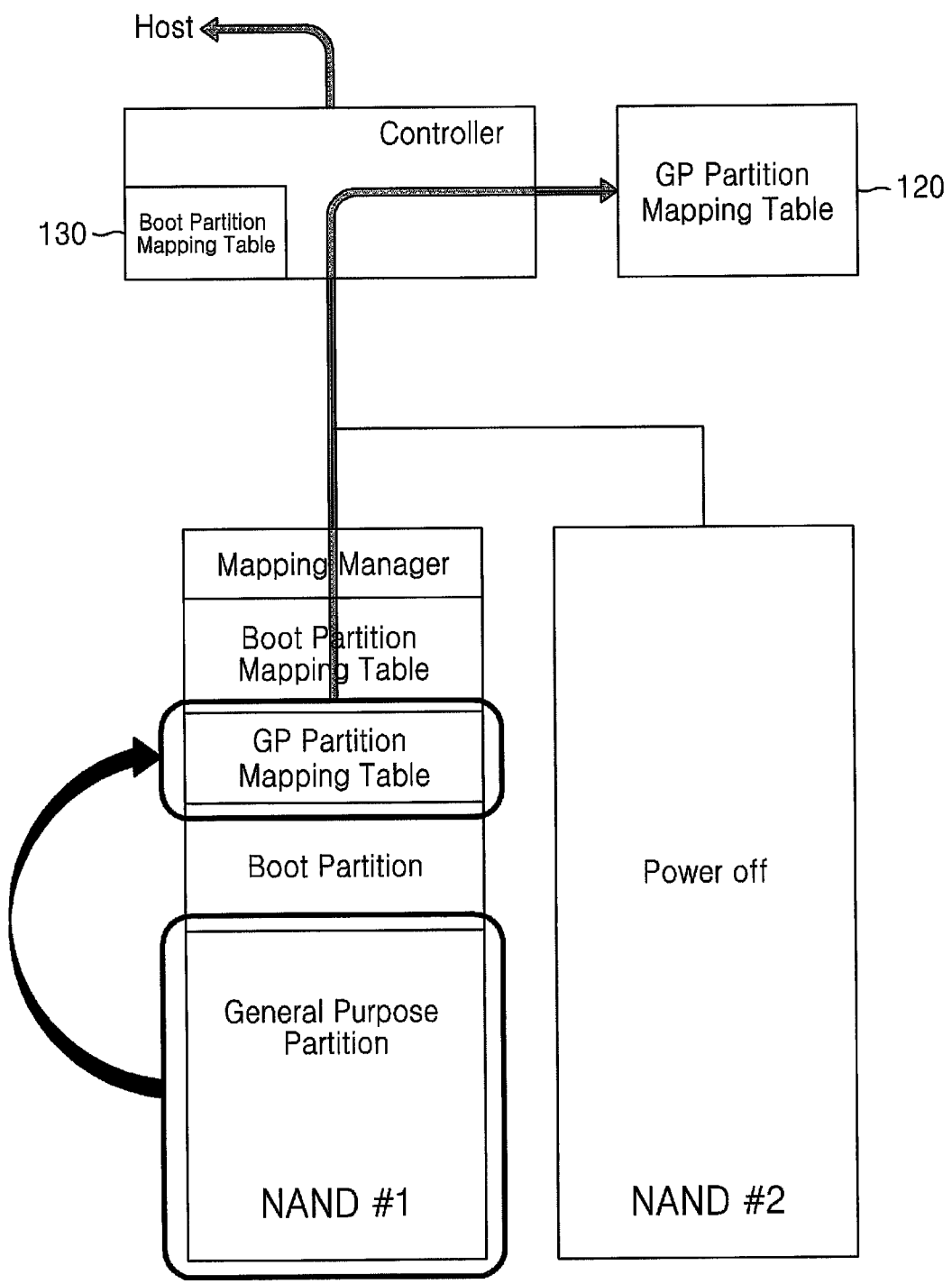
FIG. 5B is an example diagram for explaining the method illustrated in FIG. 5A.

FIG. 5A is a flowchart of a method of managing the power of the memory system 10 according to at least other example embodiments. FIG. 5B is a diagram for explaining the method illustrated in FIG. 5A.

Referring to FIGS. 5A and 5B, the controller 100 determines whether an access request for the GP region 250 is received from the host 155 in operation S210. When it is determined that the access request for the GP region 250 is received, the controller 100 supplies power to the second memory 120 in operation S220. The access request for the GP region 250 is generated when there is data to be written to the GP region 250 or when there is data to be read from the GP region 250.

When it is determined that the access request for the GP region 250 is received, the controller 100 also scan the mapping manager region 210 of the non-volatile memory device 200 to check a physical address of the second mapping table to be loaded into the second memory 120 in operation S230. Thereafter, the controller 100 loads the second mapping table stored at the physical address into the second memory 120 in operation S240.

The controller 100 may read a data file or an application program from the GP region 250 with reference to the second mapping table loaded into the second memory 120 in operation S250. The data that has been read is transmitted to the host 155 through the host I/F 110 in operation S260.

As described above, when there is the access request for the GP region 250, power is supplied to the second memory 120. In other words, the second memory 120 does not power up simultaneously when the controller 100 powers up, but the power supply to the second memory 120 is delayed until the access request for the GP region 250 is received. As a result, power consumption is reduced.

FIG. 6 is a flowchart of a method of managing the power of the memory system 10 according to at least further example embodiments. The method of FIG. 6 may be performed after the method shown in FIG. 5A.

Referring to FIG. 6, when the second memory 120 is activated, that is, when the power is supplied to the second memory 120 in operation S310, the controller 100 transmits the first mapping table loaded into the first memory 130 to the second memory 120 and stores the first mapping table in the second memory 120 in operation S320 and powers down the first memory 130 in operation S330. As described above, the first mapping table driven in the first memory 130 is stored and driven in the second memory 120 after the second memory 120 powers up, so that the first memory 130 can be powered down.

FIG. 7 is a flowchart of a method of managing the power of the memory system 10 according to at least other example embodiments. The method shown in FIG. 7 may be performed after the method shown in FIG. 6.

Referring to FIG. 7, when idle time occurs in operation S410, the controller 100 transmits the first mapping table stored in the second memory 120 to the first memory 130 and stores the first mapping table in the first memory 130 in operation S420 and backs the second mapping table stored in the second memory 120 up to the non-volatile memory device 200 in operation S430. The controller 100 also updates the mapping manager region 210 in operation S440 and then powers down the second memory 120 in operation S450. Although not shown in FIG. 7, the controller 100 may also power down a non-volatile memory that is managed with reference to the second mapping table in the second memory 120. For instance, when there is a plurality of non-volatile memory chips, a non-volatile memory chip entirely allocated for a GP region may be powered down when the second memory 120 is powered down. Such power-down of a non-volatile memory will be described in detail later.

As described above, when idle time occurs, the second memory 120 is powered down, so that power consumption is reduced. Before the second memory 120 is powered down, a series of operations is performed to back up and update the first and second mapping tables and the mapping manager.

The occurrence of idle time may be determined by the controller 100 or the host 155. For instance, the controller 100 may determine the occurrence of idle time using a timer when no command is received from the host 155 for at least a predetermined period of time (e.g., 1 second or 5 seconds). Alternatively, the host 155 may request to power down the second memory 120 using a command.

FIG. 8 is a flowchart of a method of managing the power of the memory system 10 according to at least other example embodiments. Referring to FIG. 8, when the host 155 does not need to access the non-volatile memory device 200 for at least a predetermined period of time, the second memory 120 may be powered down through the following procedure. Although not shown, non-volatile memory managed with reference to the second mapping table in the second memory 120 may also be powered down.

The host 155 transmits a flush command to the memory system 10 in operation S510. The flush command may be a host command defined to back up data of the second memory 120 before the second memory 120 is powered down. Upon receiving the flush command, the controller 100 transmits the first mapping table stored in the second memory 120 to the first memory 130 and stores it in the first memory 130 in operation S520 and backs up the second mapping table stored in the second memory 120 to the non-volatile memory device 200 in operation S530. In addition, the controller 100 updates the mapping manager region 210 in operation S540. Thereafter, the controller 100 transmits a backup completion response indicating that the backup of the data of the second memory 120 has been completed to the host 155 in operation S550. The host 155 transmits a power-down command to the memory system 10 in operation S560. In response to the power-down command, the controller 100 powers down the second memory 120 in operation S570. Thus, the memory system 10 internally powers down the second memory 120 while the host may physically supply power to the second memory 120. As shown in FIG. 13C, the power-down command may include an identifier indicating the power-down command and a DRAM power on/off field. When the DRAM power on/off field is set to "0", the power-down command indicates power-off. When the DRAM power on/off field is set to "1", the power-down command indicates power-on.

Although not shown, after powering down the second memory 120, the controller 100 may transmit a power-down completion response to the host 155. As shown in FIG. 13B, the power-down completion response may include an identifier indicating a response and a DRAM power on/off ready field. When the DRAM power on/off ready field is set to "0", the power-down completion response indicates power-off. When the DRAM power on/off ready field is set to "1", the power-down completion response indicates power-on.

FIG. 9 is a flowchart of a method of managing the power of the memory system 10 according to at least still other example embodiments. The method illustrated in FIG. 9 is similar to the method illustrated in FIG. 8, and therefore, only differences therebetween will be described to avoid redundancy.

While the memory system 10 internally powers down the second memory 120 in response to the power-down command from the host 155 in the method illustrated in FIG. 8, the host 155 cuts off a power line to the second memory 120 in the method illustrated in FIG. 9.

Figure 10:
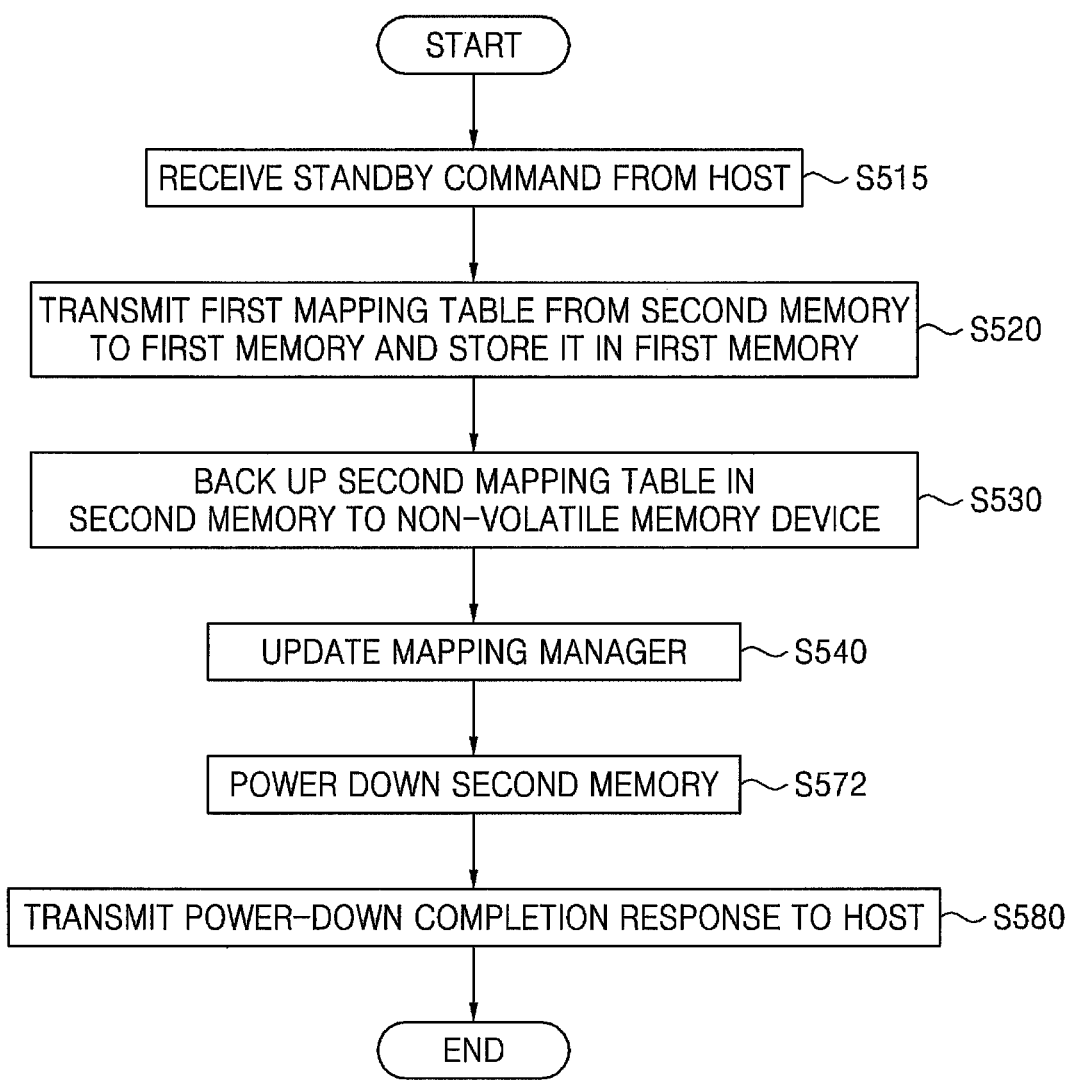
FIG. 10 is a flowchart of a method of managing the power of a memory system according to at least further example embodiments.

FIG. 10 is a flowchart of a method of managing the power of the memory system 10 according to at least further example embodiments. The method illustrated in FIG. 10 is similar to the method illustrated in FIG. 8, and therefore, differences therebetween will be described to avoid redundancy. While the host 155 uses two kinds of commands, i.e., the flush command and the power-down command to back up the data of the second memory 120 and power down the second memory 120 in the method illustrated in FIG. 8, the host 155 uses a single command, i.e., a standby command to back up the data of the second memory 120 and power down the second memory 120 in the method illustrated in FIG. 10. As illustrated in FIG. 13A, the standby command includes an identifier indicating the standby command and a DRAM power on/off field.

In detail, the host 155 transmits the standby command to the memory system 10 in operation S515. Upon receiving the standby command, the controller 100 transmits the first mapping table stored in the second memory 120 to the first memory 130 and stores it in the first memory 130 in operation S520 and backs up the second mapping table in the second memory 120 to the non-volatile memory device 200 in operation S530. In addition, the controller 100 updates the mapping manager region 210 in operation S540 and then powers down the second memory 120 in operation S572. Thus, the memory system 10 internally powers down the second memory 120 while the host may physically supply power to the second memory 120. After powering down the second memory 120, the controller 100 transmits a power-down completion response to the host 155 in operation S580.

FIG. 11 is a flowchart of a method of managing the power of the memory system 10 according to at least other example embodiments. Referring to FIG. 11, when the non-volatile memory device 200 includes a plurality of non-volatile memory elements, the host 155 transmits a NAND zone check command to the memory system 10 to detect a non-volatile memory zone storing a boot code. Here, a zone may be a group of at least one non-volatile memory element sharing a power supply with each another. For instance, non-volatile memory elements sharing a channel with each other may form a single zone.

Upon receiving the NAND zone check command, the controller 100 informs the host 155 of the non-volatile memory zone storing the boot code using a zone status response.

Then, the host 155 may power down non-volatile memory elements in zones other than the zone storing the boot code. The NAND zone check command and the zone status response are exemplified in FIGS. 13D and 13E, respectively.

While example embodiments described before are used to reduce power consumption of the second memory 120 in the memory system 10, the method illustrated in FIG. 11 is used to reduce power consumption of the non-volatile memory device 200 in the memory system 10. The method illustrated in FIG. 11 is used when the second memory 120 is powered down.

FIG. 12 is a flowchart of a method of managing the power of the memory system 10 according to at least yet other example embodiments. Referring to FIG. 12, the host 155 resumes power supply to the second memory 120 using a command in a standby state in which power supply to the second memory 120 has been interrupted.

When the host 155 receives a request to execute an application such as a web browser (e.g., SWAP) or an MP3 player (e.g., Multimedia), the host 155 transmits a DRAM wake up command to the memory system 10 in operation S810.

As illustrated in FIG. 13F, the DRAM wake up command may include an identifier indicating the DRAM wake up command and a request logical address.

In response to the DRAM wake up command, the memory system 10 may give priority to a mapping table corresponding to the request logical address and load the mapping table first to the second memory 120 in operation S830.

As described above, the host 155 wakes up DRAM, i.e., the second memory 120 and designates a mapping table to be loaded first, so that delay of mapping table loading is prevented when power supply to the second memory 120 is resumed.

Figure 14:
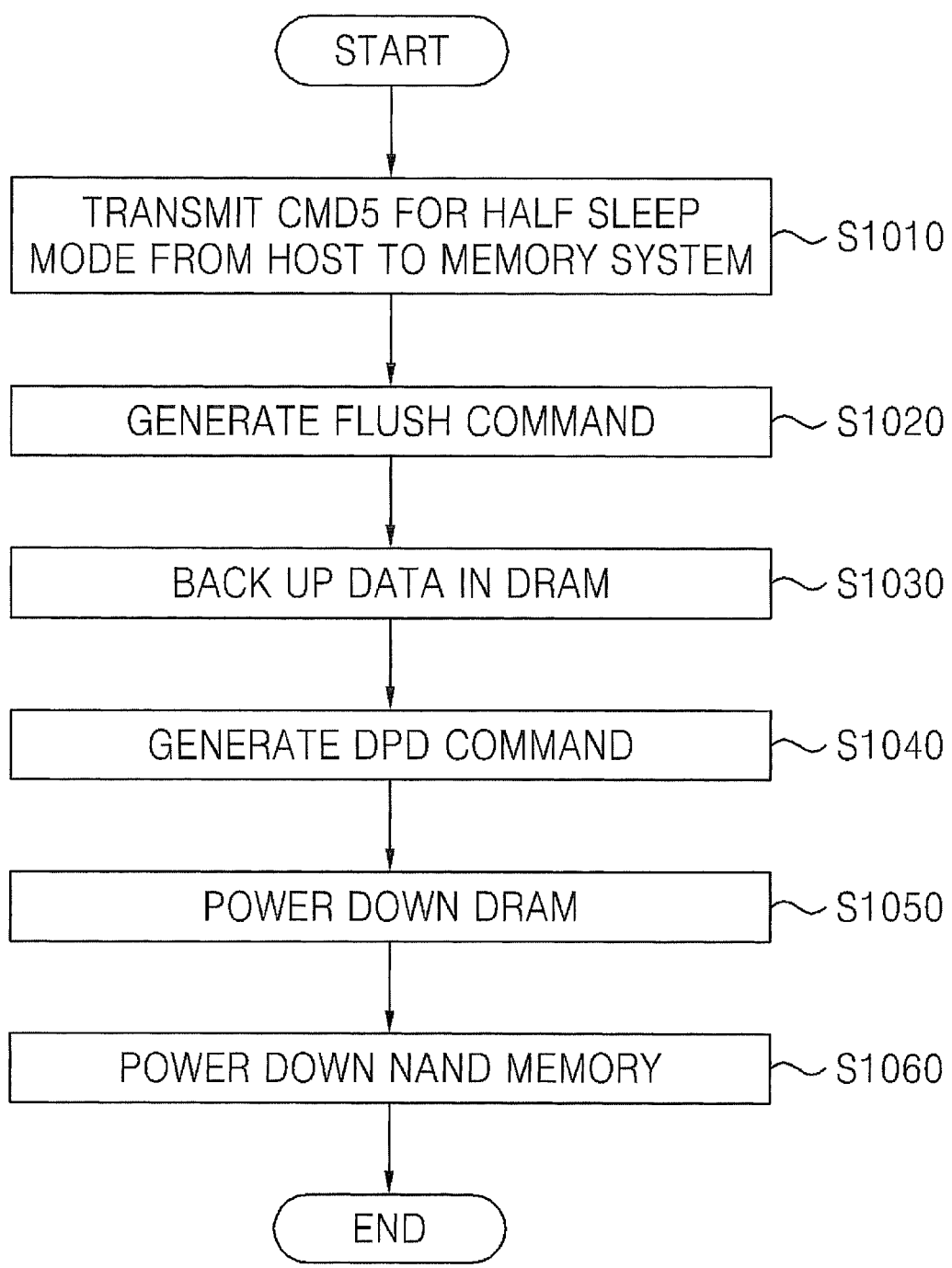
FIG. 14 is a flowchart of a method of managing the power of a memory system according to at least still other example embodiments.

FIG. 14 is a flowchart of a method of managing the power of the memory system 10 according to at least still other example embodiments. FIGS. 15A and 15B are tables showing power states in an original sleep mode and a half sleep mode, respectively. FIG. 15C is a diagram of the format of a host command for enabling the memory system 10 to enter the original sleep mode according to at least some example embodiments.

The host 155 may transmit a command CMD5 shown in FIG. 15C to the memory system 10 to enable the memory system 10 to enter the original sleep mode. The command CMD5 may be composed of 32 bits [31:0]. The lower 15 bits [14:0] may be set to "0" and the 16th lower bit [15] may be used to indicate a sleep or an awake state. For instance, when the 16th lower bit [15] is set to "1", the command CMD5 may be used as a sleep command. When the 16th lower bit [15] is set to "0", the command CMD5 may be used as an awake command.

To enable the memory system 10 to enter the original sleep mode, the host 155 may transmit the command CMD5 with the 16th lower bit [15] set to "1" to the memory system 10. Then, the memory system 10 enters the original sleep mode in response to the command CMD5. In the original sleep mode, the power of the controller 100, the second memory, i.e., DRAM 120, and the first and second NAND memory elements (e.g., first and second NAND memory chips) NAND#1 and NAND#2 included in the memory system 10 are turned off, as illustrated in FIG. 15A.

In addition, the host 155 may change and transmit the command CMD5 shown in FIG. 15C to the memory system 10 to enable the memory system 10 to enter the half sleep mode. The command CMD5 for the half sleep mode may be composed of 32 bits [31:0]. The lower 14 bits [13:0] may be set to "0" and the 15th lower bit [14] may be used to indicate the sleep or the awake state. For instance, when the 15th lower bit [14] is set to "1", the command CMD5 may be used as a half sleep command. When the 16th lower bit [15] is set to "0", the command CMD5 may be used as the awake command.

To enable the memory system 10 to enter the half sleep mode, the host 155 may transmit the command CMD5 with the 15th lower bit [14] set to "1" to the memory system 10. Then, the memory system 10 enters the half sleep mode in response to the command CMD5. In the half sleep mode, the power of the controller 100 and the first NAND memory element (e.g., the first NAND memory chip) NAND#1 included in the memory system 10 is in an on-state while the second memory, i.e., DRAM 120 and the second NAND memory element (e.g., the second NAND memory chip) NAND#2 included in the memory system 10 is turned off, as illustrated in FIG. 15B.

FIG. 14 shows the method in which the memory system 10 is enabled to enter the half sleep mode using the command CMD5 for the half sleep mode. Referring to FIG. 14, the host 155 transmits the command CMD5 for the half sleep mode to the memory system 10 in operation S1010. Then, the memory system 10 internally generates a flush command in response to the command CMD5 for the half sleep mode in operation S1020 and backs up the data of the second memory 120 in operation S1030. Next, the memory system 10 internally generates a deep power-down (DPD) command in operation S1040 and powers down the second memory 120 in operation S1050.

Lastly, the memory system 10 powers down a non-volatile memory element (e.g., the second NAND memory chip) managed with reference to the second mapping table in the second memory 120 in operation S1060.

As described above, the second memory 120 and the non-volatile memory region are powered down using a host command, thereby reducing power consumption.

FIG. 16 is a flowchart of a method of managing the power of the memory system 10 according to at least further example embodiments. Referring to FIG. 16, when a memory area of the non-volatile memory device 200 is partitioned into a plurality of regions (e.g., a mapping manager region, a first mapping table region, a second mapping table region, a boot code region, and a GP region) in operation S910, a master boot record (MBR) is generated in operation S920.

FIG. 17 is a diagram showing the structure of the MBR. Referring to FIG. 17, an MBR 600 is information stored in a 0th logical sector and includes partition information. For instance, the MBR 600 may include first partition information "partition 1" through fourth partition information "partition 4". The partition information 610 may be data of 16 bytes.

In detail, each partition information 610 may include a boot flag, a type code, a logical block address (LBA) begin, and the number of sectors.

Referring back to FIG. 16, the controller 100 generates a mapping manager according to the MBR 600 in operation S930. In other words, since the MBR 600 includes partition information 610 of the first mapping table region and partition information of the second mapping table region, address information of a first mapping table and address information of a second mapping table are extracted from the MBR 600 and the mapping manager is generated. The mapping manager is stored in the mapping manager region in operation S940.

The mapping manager may be stored in advance before the memory system 10 is put on the market or may be generated using the MBR 600. For instance, when the memory area of the non-volatile memory device 200 is partitioned by a user after being put on the market, the mapping manager may be generated according to the MBR 600 and stored in the mapping manager region.

Figure 18:
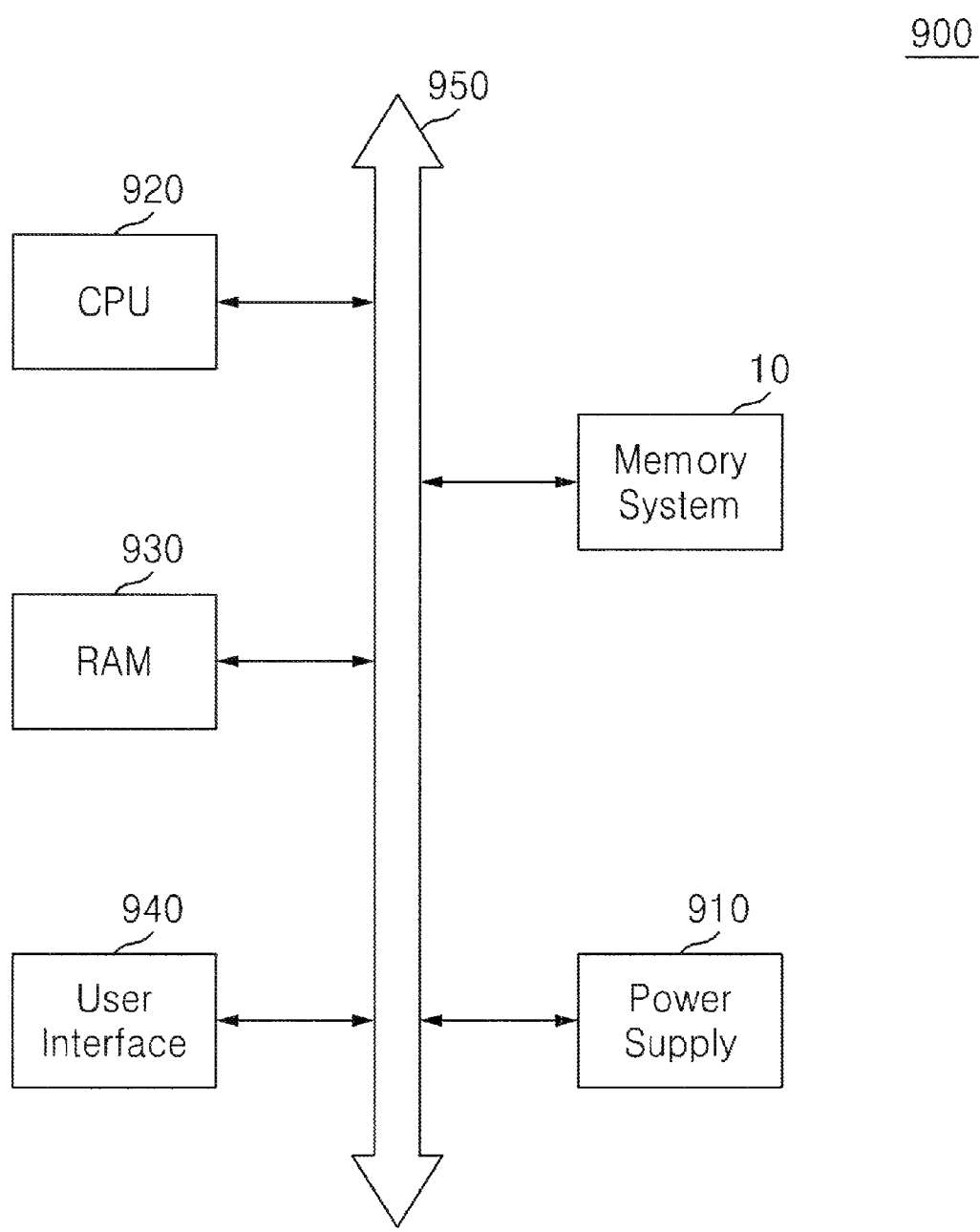
FIG. 18 and FIG. 19 are block diagrams of an electronic system equipped with a memory system according to at least some example embodiments.
Figure 19:
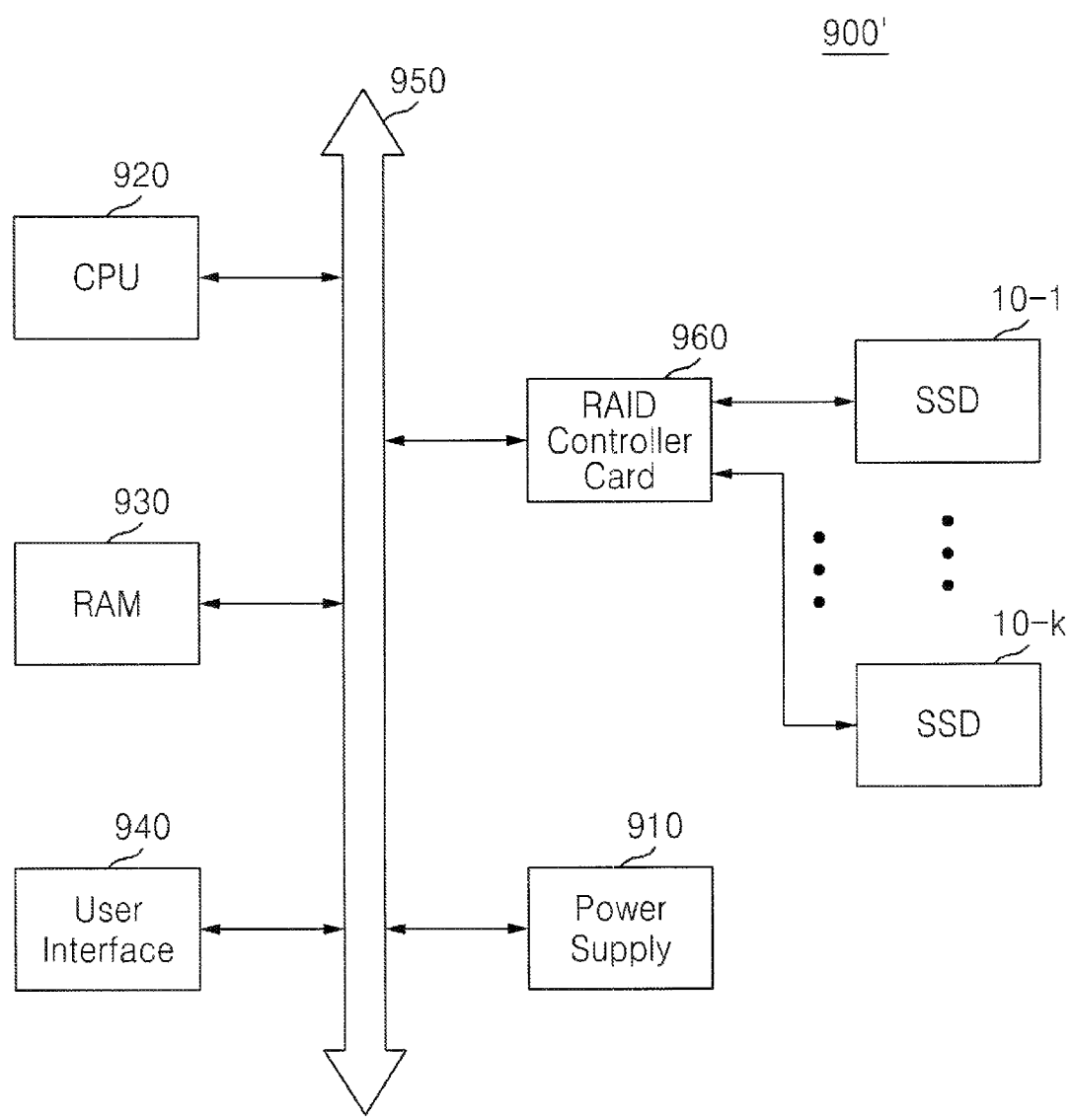

FIG. 18 and FIG. 19 are block diagrams of an electronic system equipped with a memory system according to at least some example embodiments. Referring to FIG. 18, an electronic system 900 may include the memory system 10, a power supply 910, a central processing unit (CPU) 920, a RAM 930, a user interface 940, and a system bus 950 electrically connecting these elements.

The CPU 920 controls the overall operation of the electronic system 900. The RAM 930 stores information needed for the operation of the electronic system 900. The user interface 940 provides an interface between the electronic system 900 and a user. The power supply 910 supplies electric power to the internal constituent elements such as the CPU 920, the RAM 930, the user interface 940, and the memory system 10.

The CPU 920 may correspond to the host 155, and the memory system 10 may store or read data in response to a command from the host 155.

An electronic system 900' as illustrated in FIG. 19 has a similar configuration to the electronic system 900 as illustrated in FIG. 18, and therefore only differences therebetween will be described to avoid a repeated description.

The electronic system 900' as illustrated in FIG. 19 further includes a RAID controller card 960 as compared with the electronic system as illustrated in FIG. 18. The RAID controller card 960 is connected between the host 155 and a plurality of memory systems 10-1-10-*k* to control the plurality of memory systems 10-1-10-*k* in compliance with the host 155.

The electronic systems 900 and 900' illustrated in FIGS. 18 and 19 may be a computer, a personal digital assistance (PDA), a mobile telephones (cellular telephone), a smart phone, a MP3 players, a portable multimedia player (PMP), a automotive navigation system, or a mobile internet device (MID), but are not limited to the listed products.

Example embodiments may also be embodied as computer readable code stored in computer-readable recording medium. The computer-readable recording medium includes all types of recording devices storing data that can be read by a computer system.

The computer-readable recording medium may be ROM, RAM, CD-ROM, magnetic tapes, floppy disks, optical data storage devices, etc.

In addition, when the computer-readable recording medium may be distributed in a networked computer system, the computer-readable code may be stored and carried out in a distributed way. Functional programs, code and code segments for the implementation of example embodiments can be easily deduced by programmers in the field of technology.

According to at least some example embodiments, an address mapping table of a non-volatile memory system is divided into two types of mapping tables, i.e., a mapping table of a code region which is frequently used and a mapping table of a user data region. The mapping table of the code region is driven in a first memory (e.g., SRAM) and the mapping table of the user data region is driven in a second memory (e.g., DRAM). When the user data region is not accessed, the second memory, i.e., DRAM is powered down, thereby reducing standby current.

When the non-volatile memory system is used in a mobile phone, the second memory, i.e., DRAM is not used in a simple operation, such as calling or texting, provided by an OS, so that operating current is also reduced.

Therefore, power consumption of the non-volatile memory system and an electronic system including the same is reduced.

While example embodiments have been particularly shown and described with reference to embodiments thereof, it will be understood by those of ordinary skill in the art that various changes in forms and details may be made therein without departing from the spirit and scope as defined by the following claims.

What is claimed is:

1. A method of managing power in a non-volatile memory system which includes a non-volatile memory and a controller controlling the non-volatile memory, the method comprising:
   storing a first mapping table, the first mapping table including a list of logical addresses and physical addresses corresponding to the logical addresses with respect to a code region;
   storing a second mapping table, the second mapping table including a list of logical addresses and physical addresses corresponding to the logical addresses with respect to a general purpose (GP) region in the non-volatile memory;
   powering up the non-volatile memory and the controller;
   loading the first mapping table from the non-volatile memory to a first memory at the power-up;
   loading the second mapping table from the non-volatile memory to a second memory; and
   powering down the second memory based on the loading the second mapping table.

2. The method of claim 1, wherein the non-volatile memory is partitioned into the code region configured to store a boot code, the GP region, a first mapping table region configured to store the first mapping table, a second mapping table region configured to store the second mapping table, and a mapping manager region configured to store mapping manager information, the mapping manager information including address information of the first mapping table and address information of the second mapping table.

3. The method of claim 2, wherein the loading the first mapping table from the non-volatile memory to the first memory at the power-up includes,
   scanning the mapping manager region, and extracting the address information of the first mapping table,
   loading the first mapping table to the first memory according to the address information of the first mapping table,
   reading the boot code from the code region using the first mapping table, and transmitting the boot code.

4. The method of claim 2, further comprising:
   supplying power to the second memory if the controller receives an access request for the GP region, the supplying being based on the power-up.

5. The method of claim 4, further comprising:
   after supplying power to the second memory, scanning, by the controller, the mapping manager information in the non-volatile memory, extracting, by the controller, the address information of the second mapping table, and loading, by the controller, the second mapping table to the second memory according to the address information of the second mapping table.

6. The method of claim 4, further comprising:
   backing up, by the controller, the second mapping table stored in the second memory to the non-volatile memory during an idle time; and
   powering down, by the controller, the second memory based on the backing up.

7. The method of claim 6, further comprising:
determining, by the controller, the idle time if the controller does not receive a command for at least a period of time.

8. A non-transitory computer readable medium, when executed by a non-volatile memory system, configured to instruct the non-volatile memory system to,
store a first mapping table, the first mapping table including a list of logical addresses and physical addresses corresponding to the logical addresses with respect to a code region;
store a second mapping table, the second mapping table including a list of logical addresses and physical addresses corresponding to the logical addresses with respect to a general purpose (GP) region in a non-volatile memory of the non-volatile memory system;
power up the non-volatile memory and a controller of the non-volatile memory system, the controller configured to control the non-volatile memory;
load the first mapping table from the non-volatile memory to a first memory at the power-up;
load the second mapping table from the non-volatile memory to a second memory; and
power down the second memory based on the loading the second mapping table.

* * * * *